US012777914B2

(12) United States Patent
Hong et al.

(10) Patent No.: US 12,777,914 B2
(45) Date of Patent: Oct. 27, 2026

(54) SEMICONDUCTOR DEVICE HAVING A CONTACT INTERFACE OFFSET FROM A LOWERMOST POINT OF A SOURCE/DRAIN UPPER SURFACE

(71) Applicant: SAMSUNG ELECTRONICS CO., LTD., Suwon-si (KR)

(72) Inventors: Seulki Hong, Suwon-si (KR); Younghan Kim, Suwon-si (KR); Jaeyeop Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 609 days.

(21) Appl. No.: 18/120,845

(22) Filed: Mar. 13, 2023

(65) Prior Publication Data

US 2023/0402377 A1 Dec. 14, 2023

(30) Foreign Application Priority Data

Jun. 8, 2022 (KR) ........................ 10-2022-0069224

(51) Int. Cl.
*H10D 30/62* (2025.01)
*H10D 30/67* (2025.01)
(Continued)

(52) U.S. Cl.
CPC ...... *H10W 20/435* (2026.01); *H10D 30/6211* (2025.01); *H10D 30/6219* (2025.01);
(Continued)

(58) Field of Classification Search
CPC ........... H10D 84/0158; H10D 84/0193; H10D 84/834; H10D 84/853; H10D 86/011;
(Continued)

(56) References Cited

U.S. PATENT DOCUMENTS 8,981,496 B2 3/2015 Liu et al.
9,048,317 B2 6/2015 Wann et al.
(Continued)

FOREIGN PATENT DOCUMENTS

KR 10-1534946 B1 7/2015
KR 10-1543508 B1 8/2015
(Continued)

OTHER PUBLICATIONS

Communication issued Nov. 21, 2025 by the Korean Intellectual Property Office in Korean Patent Application No. 10-2022-0069224.

*Primary Examiner* — Younes Boulghassoul
(74) *Attorney, Agent, or Firm* — Sughrue Mion, PLLC

(57) ABSTRACT

A semiconductor device includes a first gate structure, a first source/drain layer and a first contact plug. The first gate structure is formed on a substrate, and extends in a second direction parallel to an upper surface of the substrate. The first source/drain layer is formed at a side of the first gate structure in a first direction substantially parallel to the upper surface of the substrate and crossing the second direction. A central portion in the first direction of an upper surface of the first source/drain layer is lower than an edge portion in the first direction of the upper surface of the first source/drain layer. The first contact plug is formed on the first source/drain layer, and contacts the edge portion of the upper surface of the first source/drain layer.

20 Claims, 38 Drawing Sheets

(51) Int. Cl.

| | |
|---|---|
| ***H10D 64/01*** | (2025.01) |
| ***H10D 64/23*** | (2025.01) |
| ***H10W 20/00*** | (2026.01) |
| ***H10W 20/41*** | (2026.01) |
| ***H10W 20/43*** | (2026.01) |
| *H10D 30/69* | (2025.01) |
| *H10D 84/01* | (2025.01) |

(52) U.S. Cl.

CPC ..... *H10D 30/6735* (2025.01); *H10D 30/6757* (2025.01); *H10D 64/017* (2025.01); *H10D 64/021* (2025.01); *H10D 64/256* (2025.01); *H10D 64/258* (2025.01); *H10W 20/082* (2026.01); *H10W 20/089* (2026.01); *H10W 20/43* (2026.01); *H10D 30/62* (2025.01); *H10D 30/797* (2025.01); *H10D 64/0112* (2026.01); *H10D 84/0158* (2025.01); *H10W 20/076* (2026.01)

(58) Field of Classification Search

CPC ..... H10D 86/215; H10D 30/024–0245; H10D 30/62–6219; H10D 30/43–435; H10D 30/6757; H10D 30/6735; H10D 30/501–509; H10D 30/014; H10D 30/019–0198; H10D 62/119–123; H10D 84/851; H10D 84/852; H10D 84/832; H10D 84/833; H10D 30/6729; H10D 64/251–259; H10D 84/0149; H10D 84/0186; H10D 62/151; H10D 62/021; H10D 84/013; H10D 84/0133; H10D 84/017; H10D 30/6713; H10D 30/0223; H10D 30/797; H10D 84/038; H10B 12/36; H10B 12/056; H01L 21/823475; H01L 21/823871; H01L 21/76885; H01L 21/76895; H01L 21/76897; H01L 21/76804; H01L 21/76805; H01L 21/76816; H01L 21/76877; H01L 23/5226; H01L 23/5283; H01L 23/5286; H01L 23/528; H01L 23/481; H01L 23/535; H01L 23/5384; H01L 23/5386; H10W 70/65–658; H10W 20/063–0636; H10W 20/069–0698; H10W 20/081–089; H10W 20/056; H10W 20/0595; H10W 20/057; H10W 20/42–422; H10W 20/435; H10W 20/437; H10W 20/427; H10W 20/43; H10W 20/20–233; H10W 20/438

See application file for complete search history.

(56) References Cited

U.S. PATENT DOCUMENTS

| | | | | |
|---|---|---|---|---|
| 9,331,179 | B2 | 5/2016 | Liu et al. | |
| 9,379,108 | B2 | 6/2016 | Wann et al. | |
| 9,385,069 | B2 | 7/2016 | Liu et al. | |
| 9,761,677 | B2 | 9/2017 | Liu et al. | |
| 10,115,825 | B1 | 10/2018 | Liaw | |
| 10,229,911 | B2 | 3/2019 | Yoon et al. | |
| 10,411,130 | B2 | 9/2019 | Liaw | |
| 10,734,519 | B2 | 8/2020 | Liaw | |
| 10,868,000 | B2 | 12/2020 | Yu et al. | |
| 11,024,741 | B2 | 6/2021 | Song et al. | |
| 11,349,027 | B2 | 5/2022 | Liaw | |
| 2016/0308008 | A1* | 10/2016 | Yeo | H10D 30/024 |
| 2016/0351570 | A1* | 12/2016 | Park | H10D 84/0135 |
| 2019/0363009 | A1* | 11/2019 | Joe | H10D 30/024 |
| 2022/0359677 | A1* | 11/2022 | Jao | H10D 84/0151 |

FOREIGN PATENT DOCUMENTS

| | | | |
|---|---|---|---|
| KR | 10-1560871 | B1 | 10/2015 |
| KR | 10-2023249 | B1 | 11/2019 |
| KR | 10-2020-0143988 | A | 12/2020 |

* cited by examiner

SEMICONDUCTOR DEVICE HAVING A CONTACT INTERFACE OFFSET FROM A LOWERMOST POINT OF A SOURCE/DRAIN UPPER SURFACE

CROSS-REFERENCE TO RELATED APPLICATION

This application claims priority under 35 USC § 119 to Korean Patent Application No. 10-2022-0069224, filed on Jun. 8, 2022 in the Korean Intellectual Property Office (KIPO), the contents of which being herein incorporated by reference in their entirety.

BACKGROUND

Example embodiments relate to semiconductor devices and, more particularly, to semiconductor devices having contact plugs.

In a logic device, a contact plug structure may be formed to connect a gate structure and/or a source/drain to upper wirings. However, if the gate structure and/or the source/drain layer and the contact plug structure do not contact each other well, electrical signals may not be transferred from the upper wirings to the gate structure and/or the source/drain layer or a contact resistance there between may increase.

SUMMARY

It is an aspect to provide a semiconductor device having enhanced characteristics.

According to an aspect of one or more example embodiments, there is provided a semiconductor device. The semiconductor device may include a first gate structure, a first source/drain layer and a first contact plug. The first gate structure may be formed on a substrate, and extend in a second direction parallel to an upper surface of the substrate. The first source/drain layer may be formed at a side of the first gate structure in a first direction substantially parallel to the upper surface of the substrate and crossing the second direction. A central portion in the first direction of an upper surface of the first source/drain layer may be lower than an edge portion in the first direction of the upper surface of the first source/drain layer. The first contact plug may be formed on the first source/drain layer, and may contact the edge portion of the upper surface of the first source/drain layer so that a center of the first contact plug is offset from a center of the upper surface in the first direction of the first source/drain layer.

According to an aspect of one or more example embodiments, there is provided a semiconductor device. The semiconductor device may include a gate structure, a first source/drain layer and a second source/drain layer, and a first contact plug and a second contact plug. The gate structure may be formed on a substrate, and may extend in a second direction parallel to an upper surface of the substrate. The first source/drain layer and the second source/drain layer may be formed at opposite sides, respectively, in a first direction of the gate structure. The first direction may be substantially parallel to the upper surface of the substrate and may cross the second direction. A central portion in the first direction of an upper surface of each of the first source/drain layer and the second source/drain layer may be lower than an edge portion in the first direction of the upper surface. The first contact plug and the second contact plug may be formed on the first source/drain layer and the second source/drain layer, respectively. The first contact plug may contact one edge portion of opposite edge portions of the upper surface of the first source/drain layer, which may be proximal to the gate structure in the first direction, so that a center of the first contact plug is offset from a center of the upper surface of the first source/drain layer. The second contact plug may contact one edge portion of opposite edge portions of the upper surface of the second source/drain layer, which may be distal to the gate structure in the first direction, so that a center of the second contact plug is offset from a center of the upper surface of the second source/drain layer.

According to an aspect of one or more example embodiments, there is provided a semiconductor device. The semiconductor device may include first gate structures, a first source/drain layer, a first contact plug, second gate structures, a second source/drain layer and a second contact plug. The first gate structures may be formed on a substrate including a first region and a second region. The first gate structures may be spaced apart from each other in a first direction by a first distance on the first region of the substrate. Each of the first gate structures may extend in a second direction. Each of the first and second directions may be substantially parallel to an upper surface of the substrate, and the first and second directions may cross each other. The first source/drain layer may be formed on a portion of the substrate between the first gate structures. A central portion in the first direction of an upper surface of the first source/drain layer may be lower than an edge portion in the first direction of the upper surface of the first source/drain layer. The first contact plug may be formed on the first source/drain layer, and may contact the edge portion of the upper surface of the first source/drain layer so that a center of the first contact plug is offset from a center of the upper surface in the first direction of the first source/drain layer. The second gate structures may be formed on the substrate, and may be spaced apart from each other in the first direction by a second distance on the second region of the substrate. Each of the second gate structures may extend in the second direction. The second source/drain layer may be formed on a portion of the substrate between the second gate structures. A central portion in the first direction of an upper surface of the second source/drain layer may not be lower than an edge portion in the first direction of the upper surface of the second source/drain layer. The second contact plug may be formed on the second source/drain layer, and may contact the central portion of the upper surface of the second source/drain layer.

DESCRIPTION OF EMBODIMENTS

A semiconductor device and a method of manufacturing the same in accordance with example embodiments will be described more fully hereinafter with reference to the accompanying drawings. Hereinafter in the specifications (and not necessarily in the claims), two directions substantially parallel to an upper surface of a substrate and crossing each other may be referred to as a first direction D1 and a second direction D2, respectively, and a direction substantially perpendicular to the upper surface of the substrate may be referred to as a third direction D3. In example embodiments, the first and second directions D1 and D2 may be substantially perpendicular to each other.

In the semiconductor device in accordance with example embodiments, the source/drain layer and the contact plug may contact each other well, and thus the contact resistance therebetween may be reduced.

Figure 1:
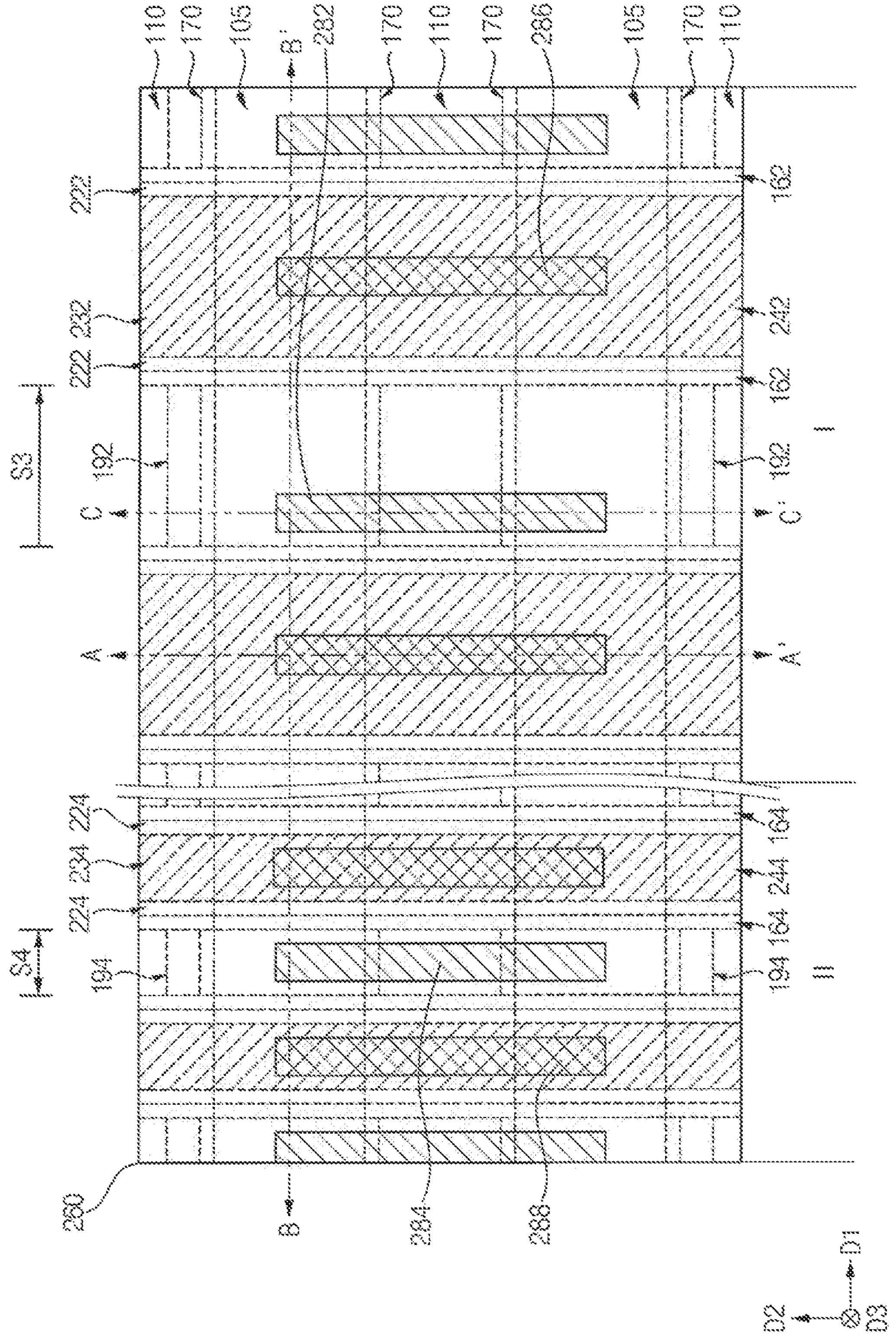
FIGS. 1 to 4 are a plan view and cross-sectional views illustrating a semiconductor device in accordance with example embodiments.
Figure 2:
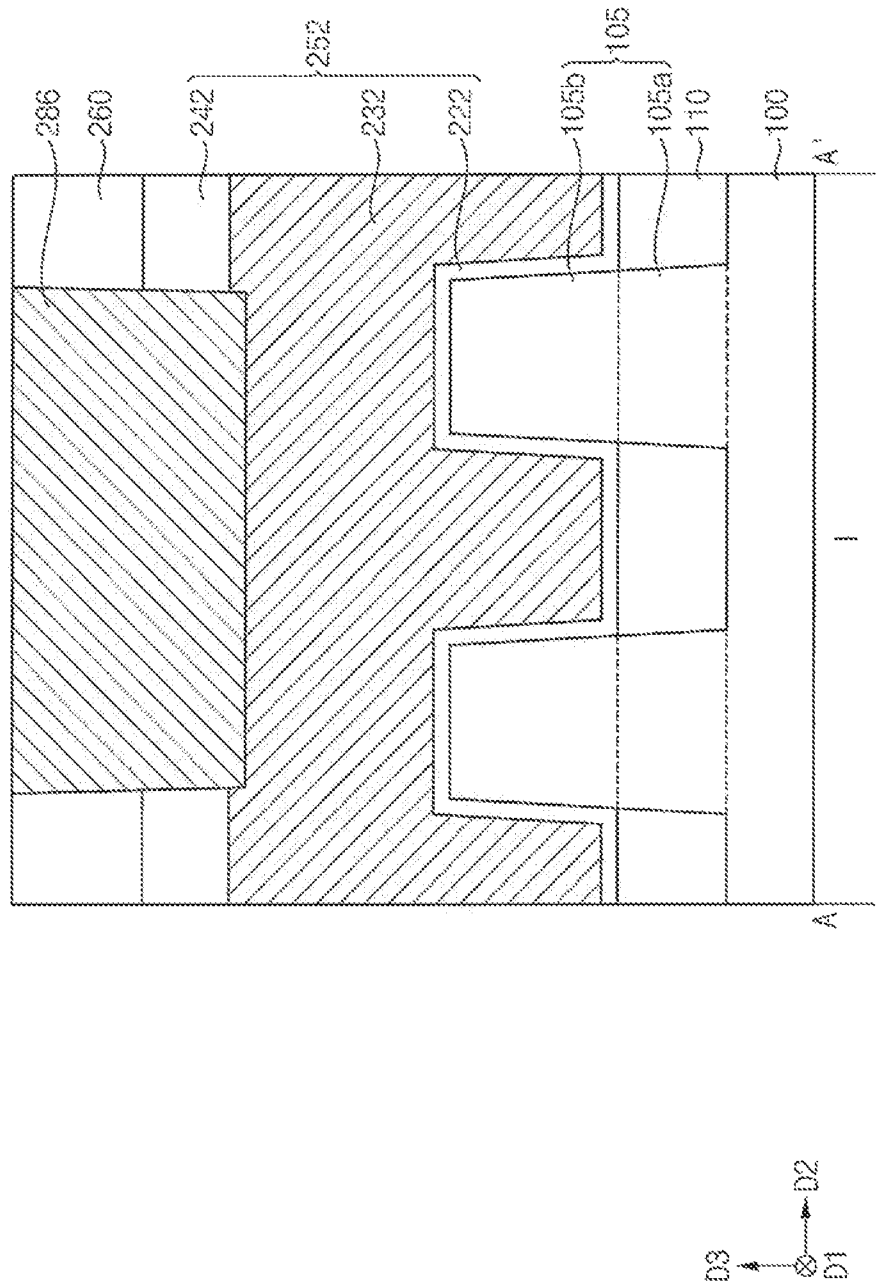
Figure 3:
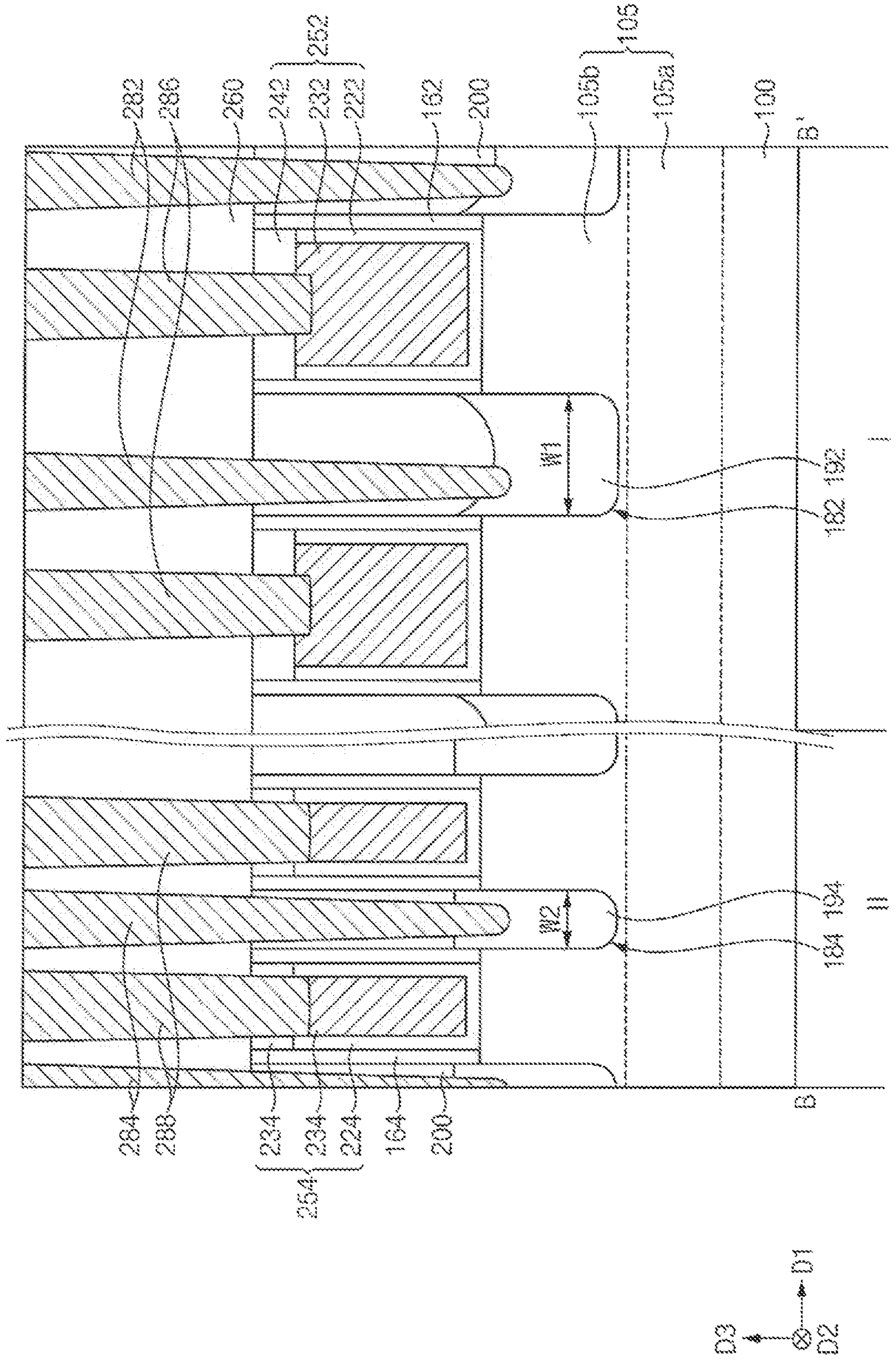
Figure 4:
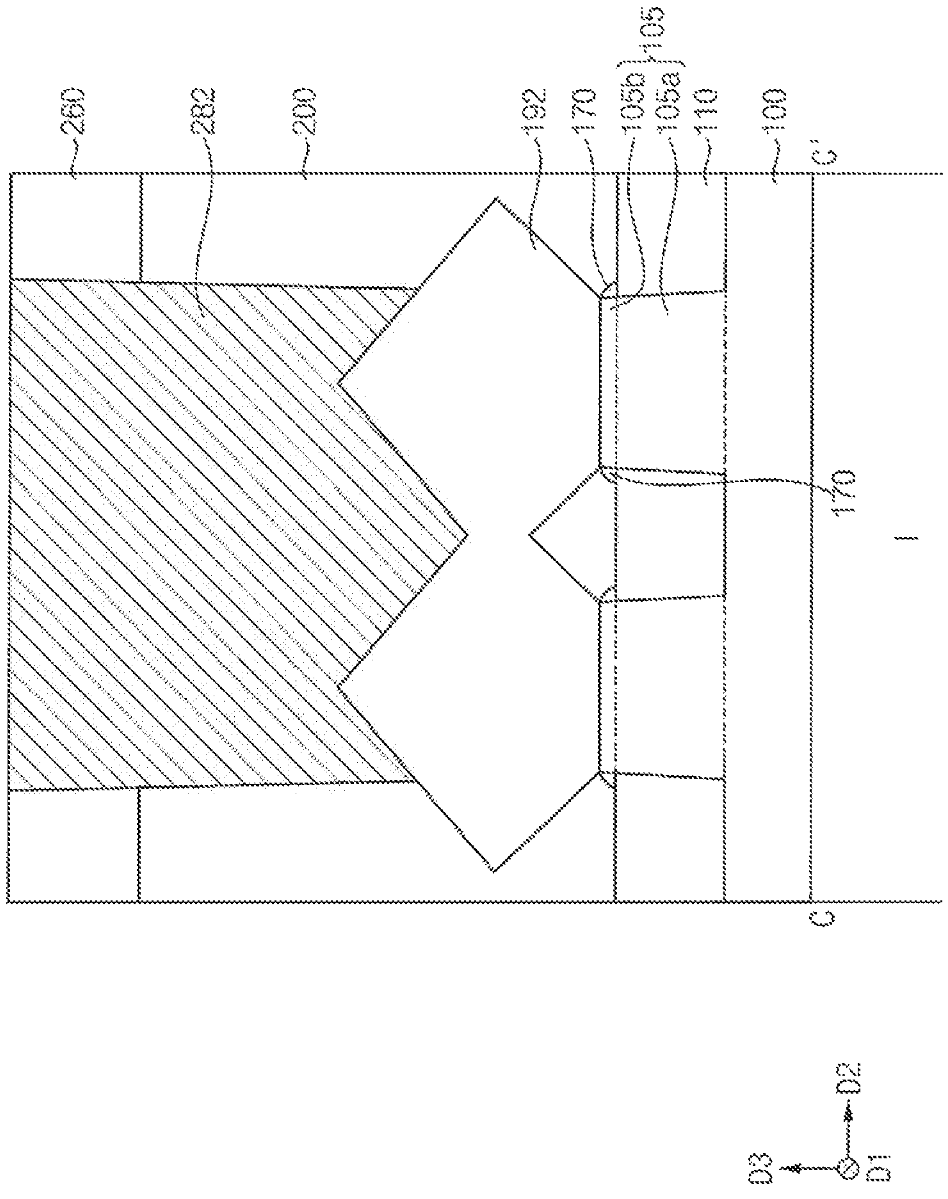

FIGS. 1 to 4 are a plan view and cross-sectional views illustrating a semiconductor device in accordance with example embodiments. Particularly, FIG. 1 is the plan view, and FIGS. 2 to 4 are the cross-sectional views. FIG. 2 is a cross-sectional view taken along line A-A' of FIG. 1, FIG. 3 is a cross-sectional view taken along line B-B' of FIG. 1, and FIG. 4 is a cross-sectional view taken along line C-C' of FIG. 1.

Referring to FIGS. 1 to 4, the semiconductor device may include a first active pattern 105, a first isolation pattern 110, a first gate structure 252 and a second gate structure 254, a first source/drain layer 192 and a second source/drain layer 194, a first gate spacer 162 and a second gate spacer 164, a fin spacer 170, a first contact plug 282, a second contact plug 284, a third contact plug 286, and a fourth contact plug 288, and a first insulating interlayer 200 and a second insulating interlayer 260 on a substrate 100.

The substrate 100 may include a semiconductor material, e.g., silicon, germanium, silicon-germanium, etc., or III-V semiconductor compounds, e.g., GaP, GaAs, GaSb, etc. In some embodiments, the substrate 100 may include a silicon-on-insulator (SDI) substrate or a germanium-on-insulator (GOI) substrate.

The substrate 100 may include a first region I and a second region II. The first region I may be a long channel region in which a channel having a relatively long length, and the second region II may be a short channel region in which a channel having a relatively short length.

FIGS. 1 to 4 show the first and second regions I and II of the substrate 100 are disposed in the first direction D1, however, example embodiments are not limited thereto, and in some embodiments, the first and second regions I and II of the substrate 100 may be disposed in the second direction D2.

The first active pattern 105 may have a fin-like shape protruding from an upper surface of the substrate 100, and thus may also be referred to as a first active fin. A lower surface of the first active pattern 105 may be covered by the first isolation pattern 110. The substrate 100 may include a field region on which the first isolation pattern 110 is formed and an active region on which the first active pattern 105 is formed.

The first active pattern 105 may include a first lower active pattern 105*a* of which a sidewall is covered by the first isolation pattern 110 and a first upper active pattern 105*b* of which a sidewall is not covered by the first isolation pattern 110. In example embodiments, the first active pattern 105 may extend in the first direction D1, and a plurality of first active patterns 105 may be spaced apart from each other in the second direction D2.

The first active pattern 105 may include a material substantially the same as that of the substrate 100, and the first isolation pattern 110 may include an oxide, e.g., silicon oxide.

In example embodiments, the first gate structure 252 may extend in the second direction D2 on the first active pattern 105 and the first isolation pattern 110 on the first region I of the substrate 100, and a plurality of first gate structures 252 may be spaced apart from each other in the first direction D1. In example embodiments, the second gate structure 254 may extend in the second direction D2 on the first active pattern 105 and the first isolation pattern 110 on the second region II of the substrate 100, and a plurality of second gate structures 254 may be spaced apart from each other in the first direction D1.

In example embodiments, the first gate structure 252 may include a first gate insulation pattern 222 and a first gate electrode 232 stacked on the first active pattern 105 and the first isolation pattern 110, and a first capping pattern 242 on the first gate insulation pattern 222 and the first gate electrode 232. The second gate structure 254 may include a second gate insulation pattern 224 and a second gate electrode 234 stacked on the second active pattern 105 and the second isolation pattern 110, and a second capping pattern 244 on the second gate insulation pattern 224 and the second gate electrode 234.

In example embodiments, the first gate insulation pattern 222 may cover a lower surface and a sidewall of the first gate electrode 232, and the first capping pattern 242 may contact upper surfaces of the first gate electrode 232 and the first gate insulation pattern 222. In example embodiments, the second gate insulation pattern 224 may cover a lower surface and a sidewall of the second gate electrode 234, and the second capping pattern 244 may contact upper surfaces of the second gate electrode 234 and the second gate insulation pattern 224.

In an example embodiment, the first gate structure 252 may further include a first interface pattern between the first gate insulation pattern 222 and the first active pattern 105 and/or the first isolation pattern 110. In example embodiments, the second gate structure 254 may further include a second interface pattern between the second gate insulation pattern 224 and the first active pattern 105 and/or the first isolation pattern 110. The first and second interface patterns may include an oxide, e.g., silicon oxide.

Each of the first and second gate insulation patterns 222 and 224 may include a metal oxide having a high dielectric constant, e.g., hafnium oxide, tantalum oxide, zirconium oxide, etc.

Each of the first and second gate electrodes 232 and 234 may include a metal nitride, e.g., titanium nitride, titanium aluminum nitride, tantalum nitride, tantalum aluminum nitride, etc., a metal alloy, e.g., titanium aluminum, titanium aluminum carbide, titanium aluminum oxynitride, titanium aluminum carbonitride, titanium aluminum oxycarbonitride, etc., a metal carbide, a metal oxynitride, a metal carbonitride, a metal oxycarbonitride, or a low resistance metal, e.g., tungsten, aluminum, copper, tantalum.

The first gate spacer 162 may be formed on each of opposite sidewalls in the first direction D1 of the first gate structure 252, and thus an outer sidewall of the first gate insulation pattern 222 and a sidewall of the first capping pattern 252 may contact an inner sidewall of the first gate spacer 162. In example embodiments, the second gate spacer 164 may be formed on each of opposite sidewalls in the first direction D1 of the second gate structure 254, and thus an outer sidewall of the second gate insulation pattern 224 and a sidewall of the second capping pattern 244 may contact an inner sidewall of the second gate spacer 164.

The fin spacer 170 may be formed on each of opposite sidewalls in the second direction D2 of the first active pattern 105.

The first and second gate spacers 162 and 164 and the fin spacer 170 may include an insulating nitride, e.g., silicon nitride (SiN), silicon oxynitride (SiON), silicon oxycarbonitride (SiOCN), etc.

The first source/drain layer 192 may be formed at each of opposite sides in the first direction D1 of the first gate structure 252, and may be interposed between ones of the first gate spacers 162 opposite in the first direction D1. The second source/drain layer 194 may be formed at each of opposite sides in the first direction D1 of the second gate structure 254, and may be interposed between ones of the second gate spacers 164 opposite in the first direction D1.

In example embodiments, a third distance S3 between corresponding ones of the first gate spacers 162 in the first direction D1 on neighboring ones of the first gate structures 252, respectively, may be greater than a fourth distance S4 between corresponding ones of the second gate spacers 164 in the first direction D1 on neighboring ones of the second gate structures 254, respectively, and thus a first width W1 in the first direction D1 of the first source/drain layer 192 in the first recess 182 may be greater than a second width W2 in the first direction D1 of the second source/drain layer 194 in the second recess 184.

In an example embodiment, a width in the first direction D1 of the first gate structure 252 may be greater than a width in the first direction D1 of the second gate structure 254, and thus a length of a first channel in a portion of the first active pattern 105 under the first gate structure 252 may be greater than a length of a second channel in a portion of the first active pattern 105 under the second gate structure 254.

In example embodiments, a cross-section of the first source/drain layer 192 in the first direction D1 may have a concave upper surface, and a central portion of an upper surface in the first direction D1 of the first source/drain layer 192 may be lower than an edge portion of the upper surface in the first direction D1 of the first source/drain layer 192 as illustrated in FIG. 3. In example embodiments, a slope of the upper surface of the first source/drain layer 192 may gradually increase from the central portion toward the edge portion in the first direction D1.

In some example embodiments, a cross-section of the second source/drain layer 194 in the first direction D1 may have a flat upper surface, and a height of the upper surface of the second source/drain layer 194 may be substantially constant in the first direction D1. Thus, a central portion of the upper surface in the first direction D1 of the second source/drain layer 194 may be substantially coplanar with an edge portion of the upper surface in the first direction D1 of the second source/drain layer 194. In example embodiments, the central portion of the upper surface of the first source/drain layer 192 may be lower than the upper surface of the second source/drain layer 194.

A cross-section in the second direction D2 of each of the first and second source/drain layers 192 and 194 may have a shape of a pentagon or a rhombus. In example embodiments, if a distance between neighboring ones of the first active patterns 105 in the second direction D2 on the first region I of the substrate 100 is small, corresponding ones of the first source/drain layers 192 on the neighboring ones of the first active patterns 105, respectively, may be merged with each other, and if a distance between neighboring ones of the second active patterns 105 in the second direction D2 on the second region II of the substrate 100 is small, corresponding ones of the second source/drain layers 194 on the neighboring ones of the first active patterns 105, respectively, may be merged with each other.

In an example embodiment, each of the first and second source/drain layers 192 and 194 may include single crystalline silicon-germanium doped with p-type impurities, and thus may serve as a source/drain region of a p-channel metal oxide semiconductor (PMOS) transistor. In some example embodiments, each of the first and second source/drain layers 192 and 194 may include single crystalline silicon or single crystalline silicon carbide doped with n-type impurities, and thus may serve as a source/drain region of an n-channel metal oxide semiconductor (NMOS) transistor.

Each of the first and second source/drain layers 192 and 194 may be covered by the first insulating interlayer 200. The second insulating interlayer 260 may be formed on the first insulating interlayer 200, the first and second gate structures 252 and 254, and the first and second gate spacers 162 and 164.

Each of the first and second insulating interlayers 200 and 260 may include an insulating material, e.g., silicon oxycarbide (SiOC), silicon nitride (SiN), silicon oxynitride (SiON), silicon carbonitride (SiCN), silicon oxycarbonitride (SiOCN), etc.

The first and second contact plugs 282 and 284 may extend through the first and second insulating interlayers 200 and 260, and may contact upper surfaces of the first and second source/drain layers 192 and 194, respectively.

In example embodiments, the second contact plug 284 may contact the central portion of the upper surface in the first direction D1 of the second source/drain layer 194, and the first contact plug 282 may contact the edge portion of the upper surface in the first direction D1 of the first source/drain layer 192. In some example embodiments, a center of the second contract plug 284 may be offset from a center of the upper surface in the first direction D1 of the second source/drain layer 194. Thus, even though the first source/drain layer 192 has the concave upper surface and the central upper portion in the first direction D1 of the upper surface of the first source/drain layer 192 is lower than the edge portion in the first direction D1 of the upper surface of the first source/drain layer 192, the first contact plug 282 may contact the upper portion of the upper surface of the first source/drain layer 192 having a relatively large height, so that the first contact plug 282 and the first source/drain layer 192 may contact each other well, which may be illustrated in detail below with reference to FIGS. 5 to 16.

FIG. 3 shows a distance from one of the first contact plugs 282 at opposite sides, respectively, in the first direction D1 of the first gate structure 252 to the first gate structure 252 is less than a distance from the other one of the first contact plugs 282 at the opposite sides, respectively, in the first direction D1 of the first gate structure 252 to the first gate structure 252, however, example embodiments are not limited thereto. That is, the first contact plug 282 may contact any one of opposite edge portions in the first direction D1 of the upper surface of the first source/drain layer 192, and may contact a first one of the opposite edge portions in the first direction D1 of the upper surface of the first source/drain layer 192, which may be relatively close or proximal to the first gate structure 254, or a second one of the opposite edge portions in the first direction D1 of the upper surface of the first source/drain layer 192, which may be relatively distal to the first gate structure 254.

The third and fourth contact plugs 286 and 288 may extend through the second insulating interlayer 260, and may contact upper surfaces of the first and second gate electrodes 232 and 234 included in the first and second gate structures 252 and 254, respectively.

In an example embodiment, each of the first to fourth contact plugs 282, 284, 286, 288 may include a conductive pattern and a barrier pattern covering a lower surface and a sidewall of the conductive pattern. The conductive pattern may include a metal, e.g., molybdenum, cobalt, tungsten, etc., the barrier pattern may include a metal nitride, e.g., titanium nitride, tantalum nitride, tungsten nitride, etc.

Vias and wirings that may apply electrical signals to the first to fourth contact plugs 282, 284, 286 and 288 may be further formed thereon.

The semiconductor device may include the first gate structure 252 on the first active fin 105 serving as a channel and the first source/drain layers 192 on portions of the first active fin 105 adjacent to the first gate structure 252, and the second gate structure 254 on the first active fin 105 and the second source/drain layers 194 on portions of the first active fin 105 adjacent to the second gate structure 254. Thus, the semiconductor device may include a finFET.

In the semiconductor device, when compared to the flat upper surface of the second source/drain layer 194 between neighboring ones of the second gate structures 254 spaced apart from each other in the first direction D1 by a relatively small distance, the first source/drain layer 192 between neighboring ones of the first gate structures 252 spaced apart from each other in the first direction D1 by a relatively large distance may have the concave upper surface. Thus, the central portion in the first direction D1 of the upper surface of the first source/drain layer 192 may be lower than the edge portion in the first direction D1 of the upper surface of the first source/drain layer 192, and may be lower than the upper surface of the second source/drain layer 194.

However, the first contact plug 282 may contact the edge portion in the first direction D1 of the upper surface of the first source/drain layer 192, which may have a relatively large height, so that the first contact plug 282 and the first source/drain layer 192 may contact each other well, and the contact resistance between the first contact plug 282 and the first source/drain layer 192 may not increase.

FIGS. 5 to 16 are plan views and cross-sectional views illustrating a method of manufacturing a semiconductor device in accordance with example embodiments. Particularly, FIGS. 5, 8, 12 and 15 are the plan views, and FIGS. 6-7, 9-11, 13-14 and 16 are the cross-sectional views.

Figure 6:
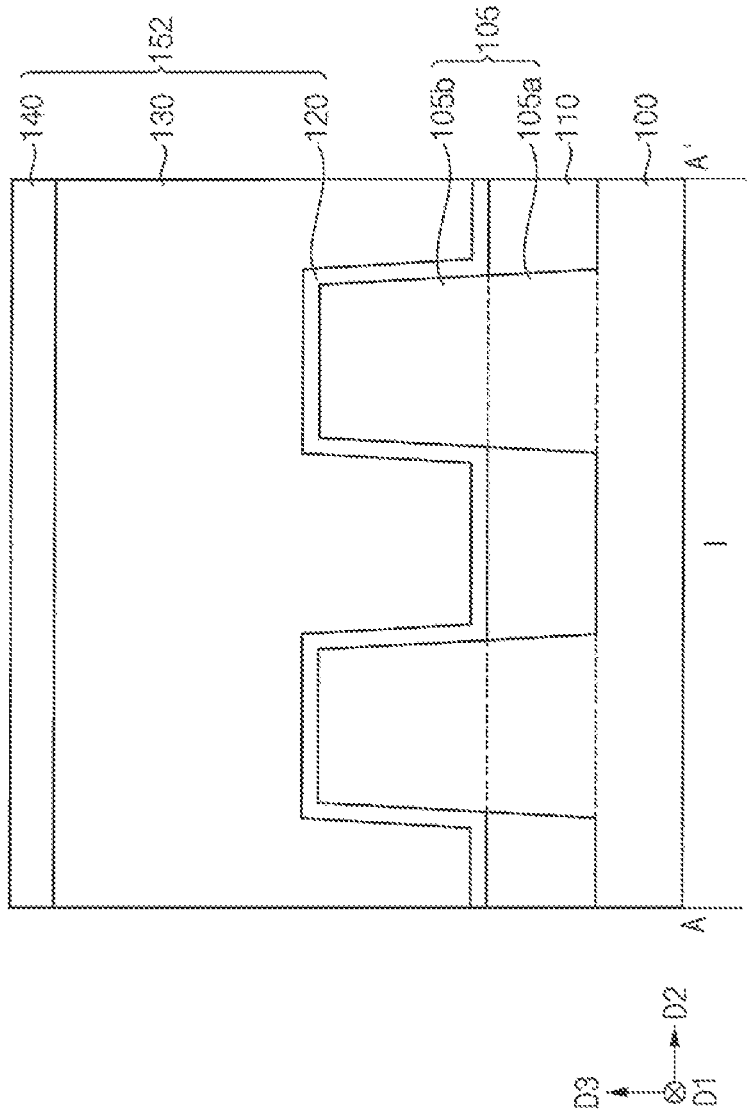
Figure 9:
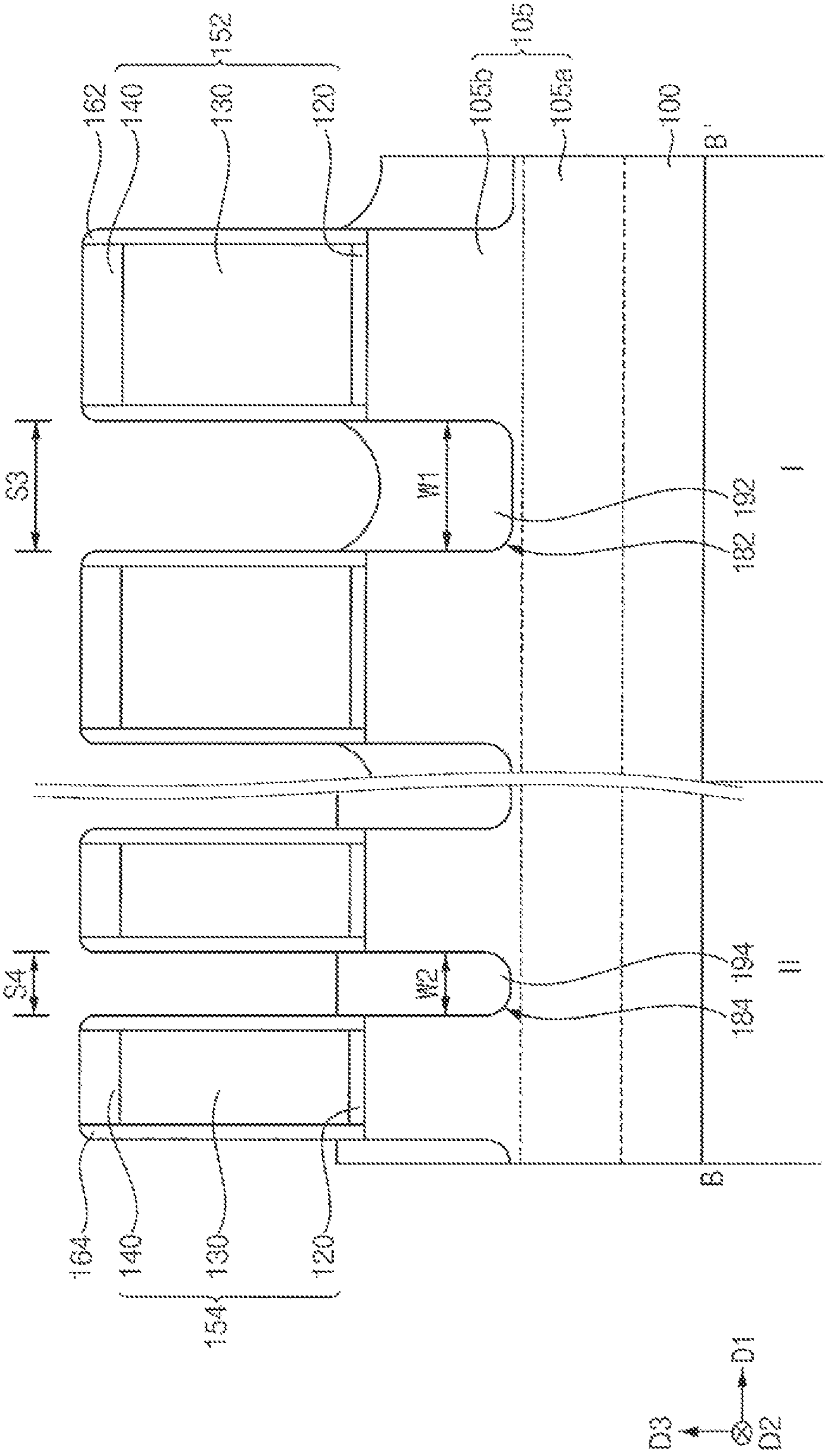
Figure 10:
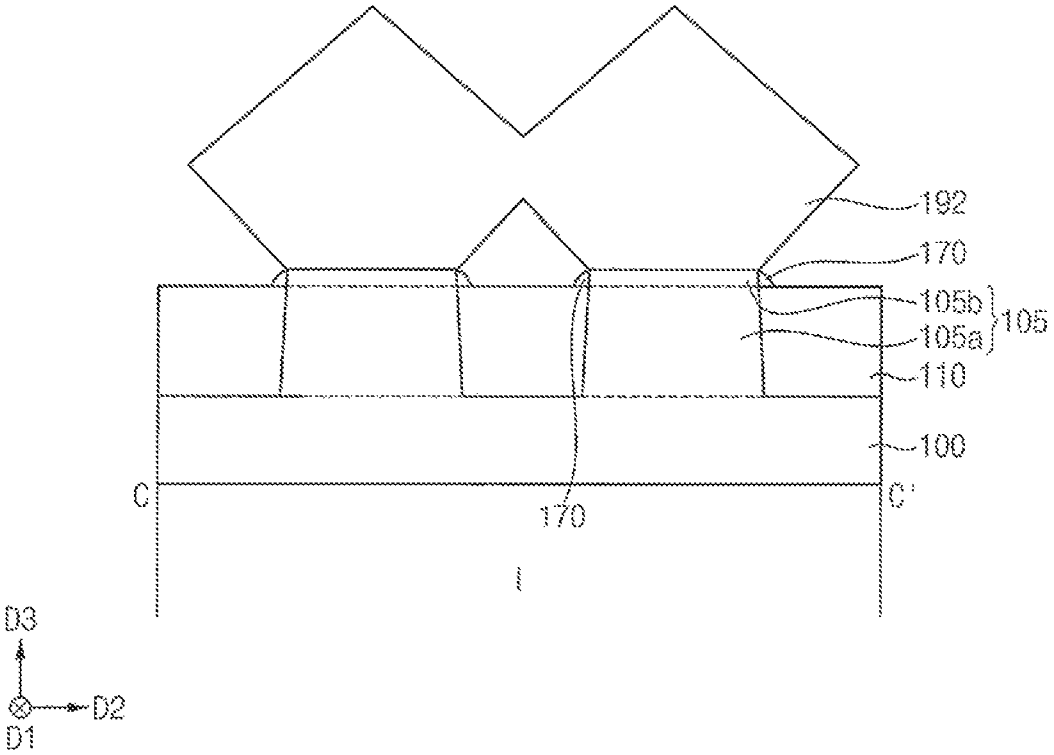
Figure 13:
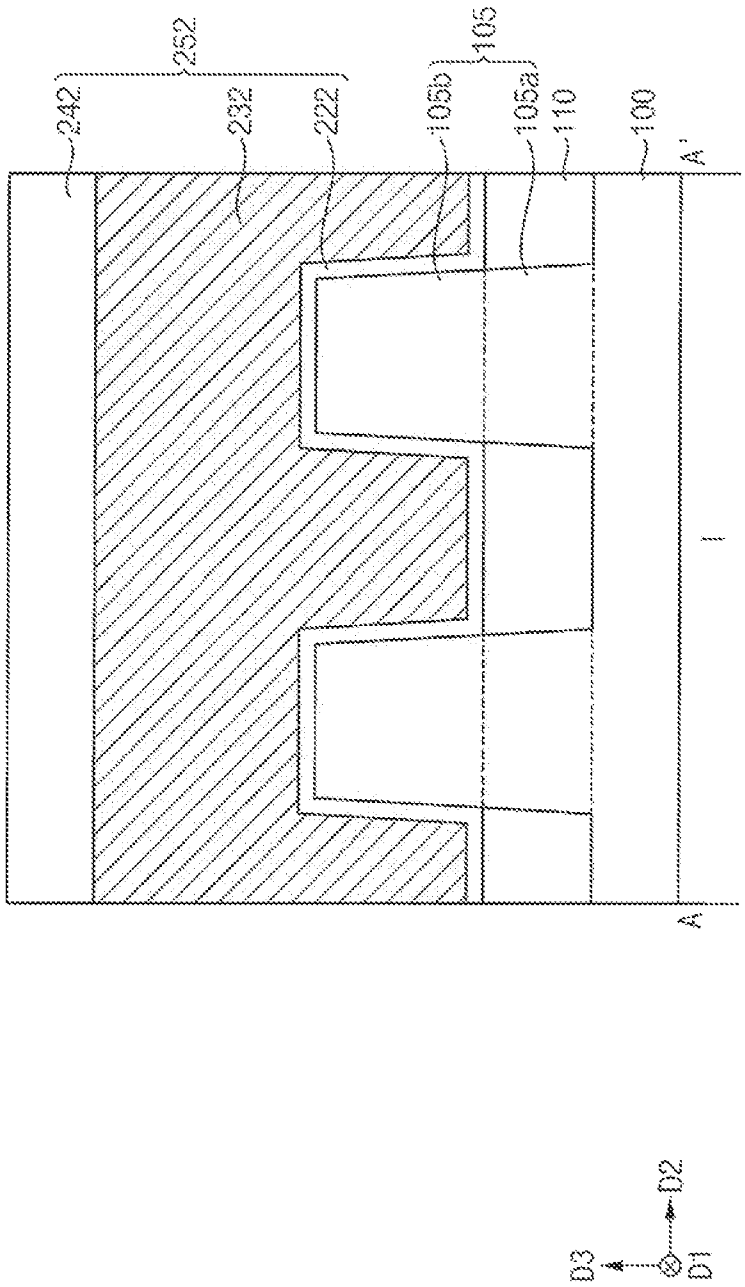

FIGS. 6 and 13 are cross-sectional views taken along lines A-A' of corresponding plan views, respectively, FIGS. 7, 9, 11, 14 and 16 are cross-sectional views taken along lines B-B' of corresponding plan views, respectively, FIG. 10 is a cross-sectional view taken along line C-C' of a corresponding plan view.

Figure 5:
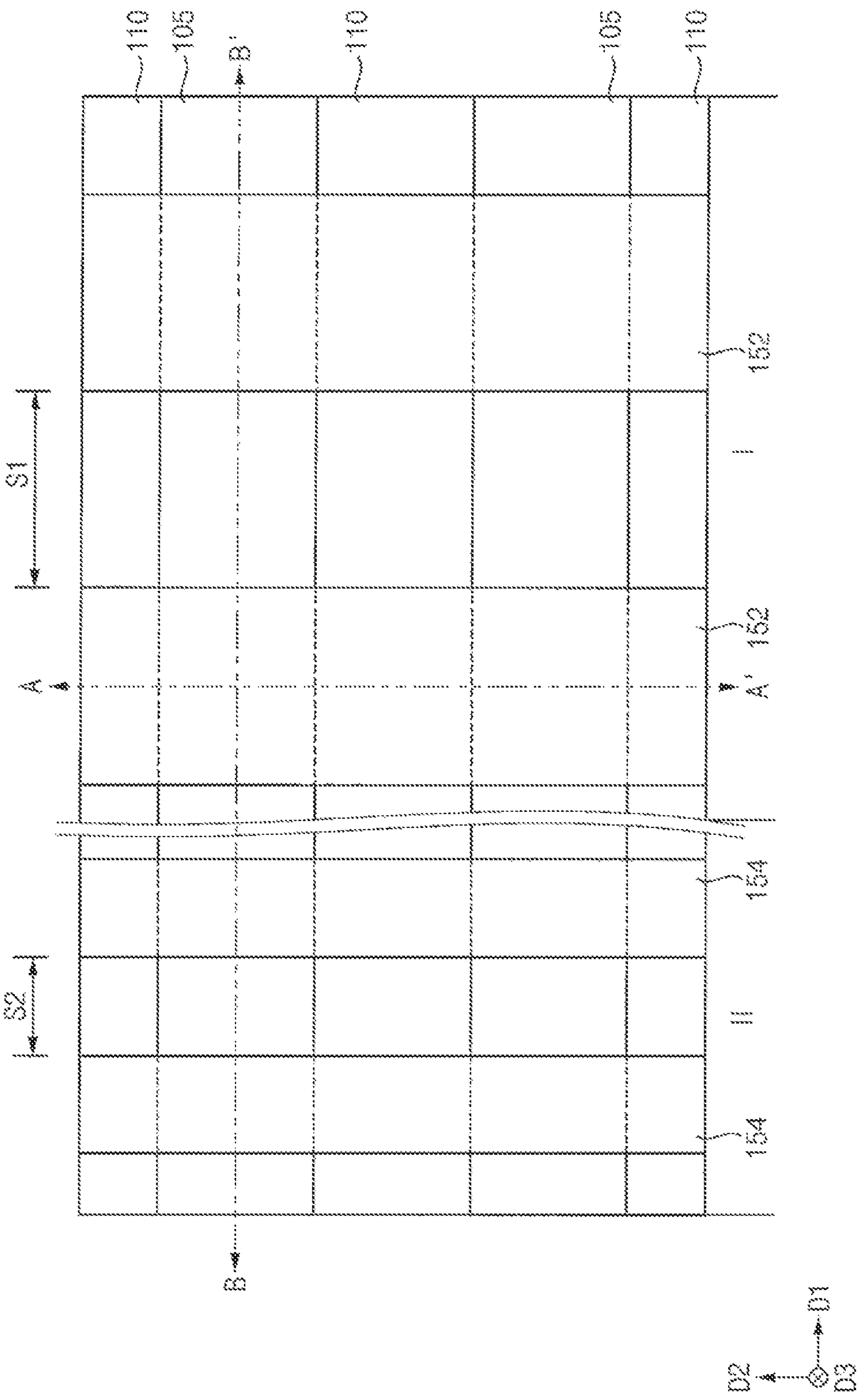
FIGS. 5 to 16 are plan views and cross-sectional views illustrating a method of manufacturing a semiconductor device in accordance with example embodiments.
Figure 7:
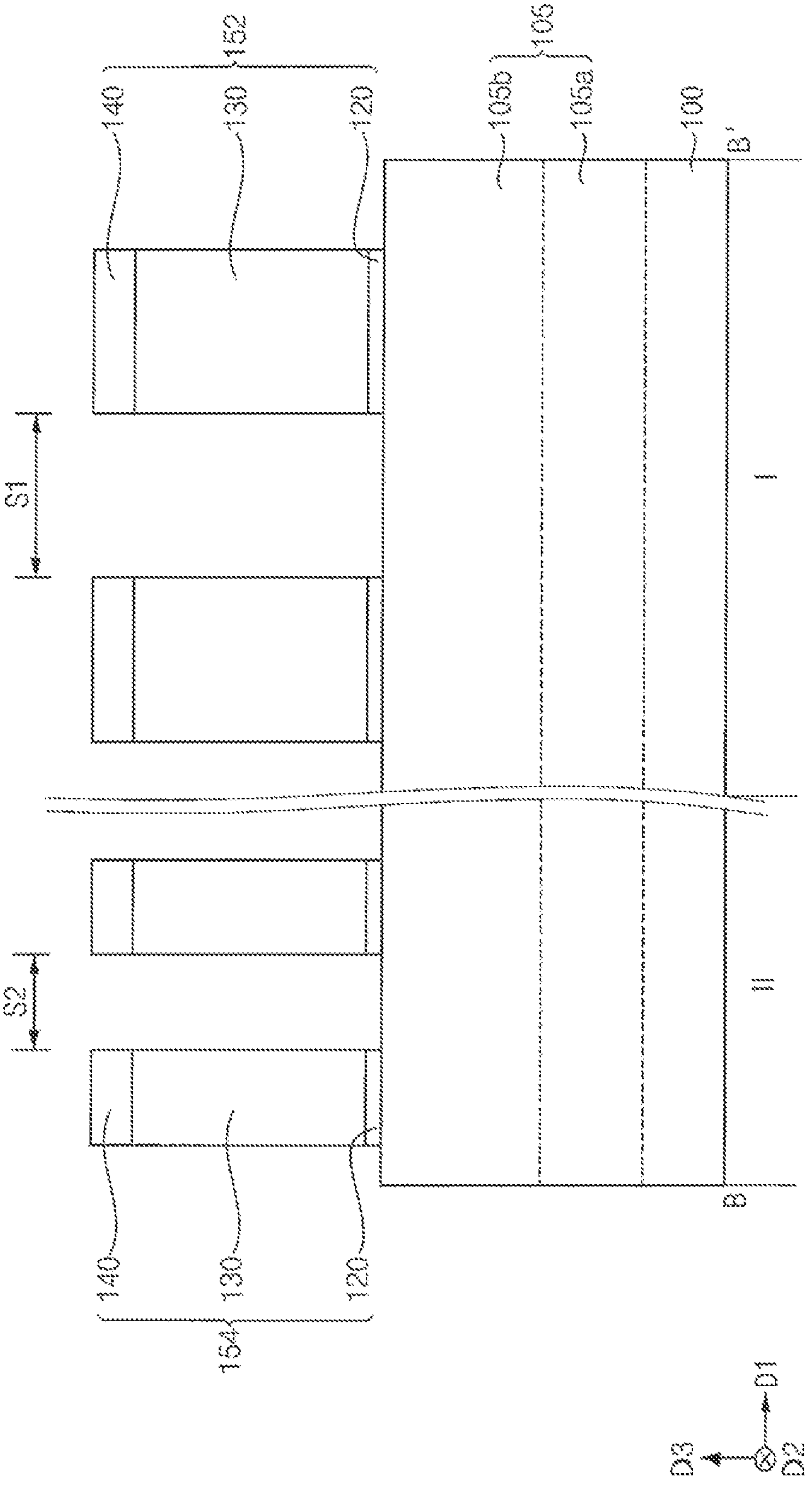

Referring to FIGS. 5 to 7, an upper portion of a substrate 100 including first and second regions I and II may be removed to form a first trench, and a first isolation pattern 110 may be formed in a lower portion of the first trench.

FIGS. 5 to 7 show that the first and second regions I and II are arranged in the first direction D1, however, example embodiments are not limited thereto, and the first and second regions I and II of the substrate 100 may be arranged in the second direction D2.

In example embodiments, the first isolation pattern 110 may be formed by forming a first isolation layer on the substrate 100 to fill the first trench, planarizing the first isolation layer until an upper surface of the substrate 100 is exposed, and removing an upper portion of the first isolation layer to expose an upper portion of the first trench. As the first isolation pattern 110 is formed on the substrate 100, a first active pattern 105 may be defined on the substrate 100.

The planarization process may include, e.g., a chemical mechanical polishing (CMP) process and/or an etch back process.

In example embodiments, the first active pattern 105 may extend in the first direction D1, and a plurality of first active patterns 105 may be spaced apart from each other in the second direction D2.

First and second dummy gate structures 152 and 154 may be formed on the first and second regions I and II, respectively, of the substrate 100 having the first active pattern 105 and the first isolation pattern 110 thereon. Each of the first and second dummy gate structures 152 and 154 may include a first dummy gate insulation pattern 120, a first dummy gate electrode 130 and a first dummy gate mask 140 sequentially stacked.

The first dummy gate insulation pattern 120 may include an oxide, e.g., silicon oxide, the first dummy gate electrode 130 may include, e.g., polysilicon, and the first dummy gate mask 140 may include an insulating nitride, e.g., silicon nitride.

In example embodiments, each of the first and second dummy gate structures 152 and 154 may extend in the second direction D2. A plurality of first dummy gate structures 152 may be spaced apart from each other in the first direction D1 on the first region I of the substrate 100, and a plurality of second dummy gate structures 154 may be spaced apart from each other in the first direction D1 on the second region II of the substrate 100.

In example embodiments, a first distance S1 between neighboring ones of the first dummy gate structures 152 in the first direction D1 may be greater than a second distance S2 between neighboring ones of the second dummy gate structures 154 in the first direction D1. A width in the first direction D1 of the first dummy gate structure 152 may be greater than a width in the first direction D1 of the second dummy gate structure 154, however, example embodiments are not limited thereto.

Figure 8:
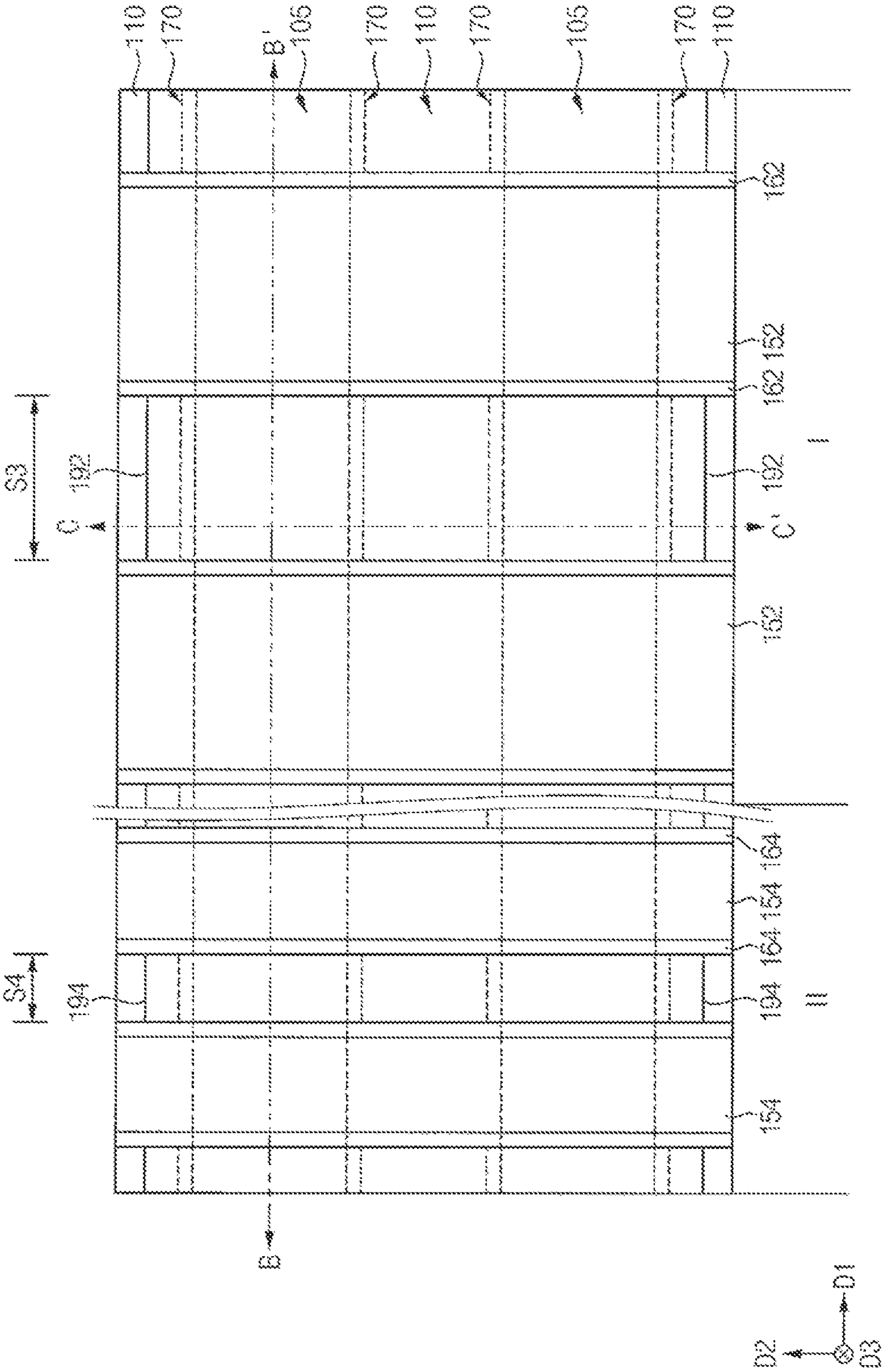

Referring to FIGS. 8 to 10, a first gate spacer 162 may be formed on each of opposite sidewalls in the first direction D1 of the first dummy gate structure 152, and a second gate spacer 164 may be formed on each of opposite sidewalls in the first direction D1 of the second dummy gate structure 154. In example embodiments, a fin spacer 170 may be formed on each of opposite sidewalls in the second direction D2 of the first active pattern 105.

The first and second gate spacers 162 and 164 and the fin spacer 170 may be formed by forming a first spacer layer on the substrate 100 having the first active pattern 105, the first isolation pattern 110 and the first and second dummy gate structures 152 and 154 thereon, and anisotropically etching the first spacer layer. The first and second gate spacers 162 and 164 and the fin spacer 170 may include an insulating nitride, e.g., silicon nitride (SiN), silicon oxynitride (SiON), silicon oxycarbonitride (SiOCN), etc.

In example embodiments, a thickness of the first spacer layer may be substantially constant, and thus a width in the first direction of the first gate spacer 162 may be substantially equal to a width in the first direction of the second gate spacer 164.

As the first distance S1 between neighboring ones of the first dummy gate structures 152 in the first direction D1 is greater than the second distance S2 between neighboring ones of the second dummy gate structures 154 in the first direction D1, and thus a third distance S3 between corresponding ones of the first gate spacers 162 opposite to each other in the first direction D1 on the neighboring ones, respectively, of the first dummy gate structures 152 in the first direction D1 may be greater than a fourth distance S4 between corresponding ones of the second gate spacers 164 opposite to each other in the first direction D1 on the neighboring ones, respectively, of the second dummy gate structures 154 in the first direction D1.

Upper portions of the first active pattern 105 may be etched using the first and second dummy gate structures 152 and 154 and the first and second gate spacers 162 and 164 as an etching mask to form first and second recesses 182 and 184, respectively.

FIG. 9 shows that each of the first and second recesses 182 and 184 is formed by partially removing the first upper active pattern 105*b*, however, example embodiments are not limited thereto, and each of the first and second recesses 182 and 184 may be formed by partially removing the first lower active pattern 105*a* as well as the first upper active pattern 105*b*.

In example embodiments, a first width W1 in the first direction D1 of the first recess 182 may be greater than a second width W2 in the first direction D1 of the second recess 184.

The anisotropic etching process of the first spacer layer and the etching process for forming the first and second recesses 182 and 184 may be performed in-situ.

A selective epitaxial growth (SEG) process may be performed using upper surfaces of the first active pattern 105 exposed by the first and second recesses 182 and 184 as a seed to form first and second source/drain layers 192 and 194, respectively, on portions of the first active pattern 105 on the first and second regions I and II, respectively, of the substrate 100.

The SEG process may be performed using a silicon source gas, e.g., dichlorosilane ($SiH_2Cl_2$) gas, a germanium source gas, e.g., germane ($GeH_4$) gas, and a p-type impurity source gas, e.g., diborane ($B_2H_6$) gas, so that a single crystalline silicon-germanium layer doped with p-type impurities may be formed as each of the first and second source/drain layers 192 and 194.

In some example embodiments, the SEG process may be performed using a silicon source gas, e.g., disilane ($Si_2H_6$) gas and an n-type impurity source gas, e.g., $PH_3$, $POCl_3$, $P_2O_5$, etc., so that a single crystalline silicon layer doped with n-type impurities or a single crystalline silicon carbide layer doped with n-type impurities may be formed as each of the first and second source/drain layers 192 and 194.

The first and second source/drain layers 192 and 194 may fill the first and second recesses 182 and 184, respectively, and may further grow to contact lower sidewalls of the first and second gate spacers 162 and 164, respectively. Each of the first and second source/drain layers 192 and 194 may grow in a horizontal direction as well as a vertical direction, so as to have a cross-section taken along the second direction D2 having a shape of a pentagon or a rhombus. If a distance between ones of the first active patterns 105 neighboring in the second direction D2 on the first region I of the substrate 100 is small, ones of the first source/drain layers 192 grown from upper surfaces of the neighboring ones of the first active patterns 105 may be merged with each other. Likewise, if a distance between ones of the first active patterns 105 neighboring in the second direction D2 on the second region II of the substrate 100 is small, ones of the second source/drain layers 194 grown from upper surfaces of the neighboring ones of the first active patterns 105 may be merged with each other.

In example embodiments, the first and second source/drain layers 192 and 194 may be formed by the same SEG process, and thus the second source/drain layer 194, which may fill the second recess 184 having a relatively small width, may have a flat upper surface, while the first source/drain layer 192, which may fill the first recess 182 having a relatively large width, may have a concave upper surface. A central portion in the first direction D1 of the upper surface of the first source/drain layer 192 may be lower than the upper surface of the second source/drain layer 194.

In an example embodiment, a slope of the upper surface of the first source/drain layer 192 with respect to the upper surface of the substrate 100 may gradually increase from the central portion toward the edge portion of the upper surface of the first source/drain layer 192.

Figure 11:
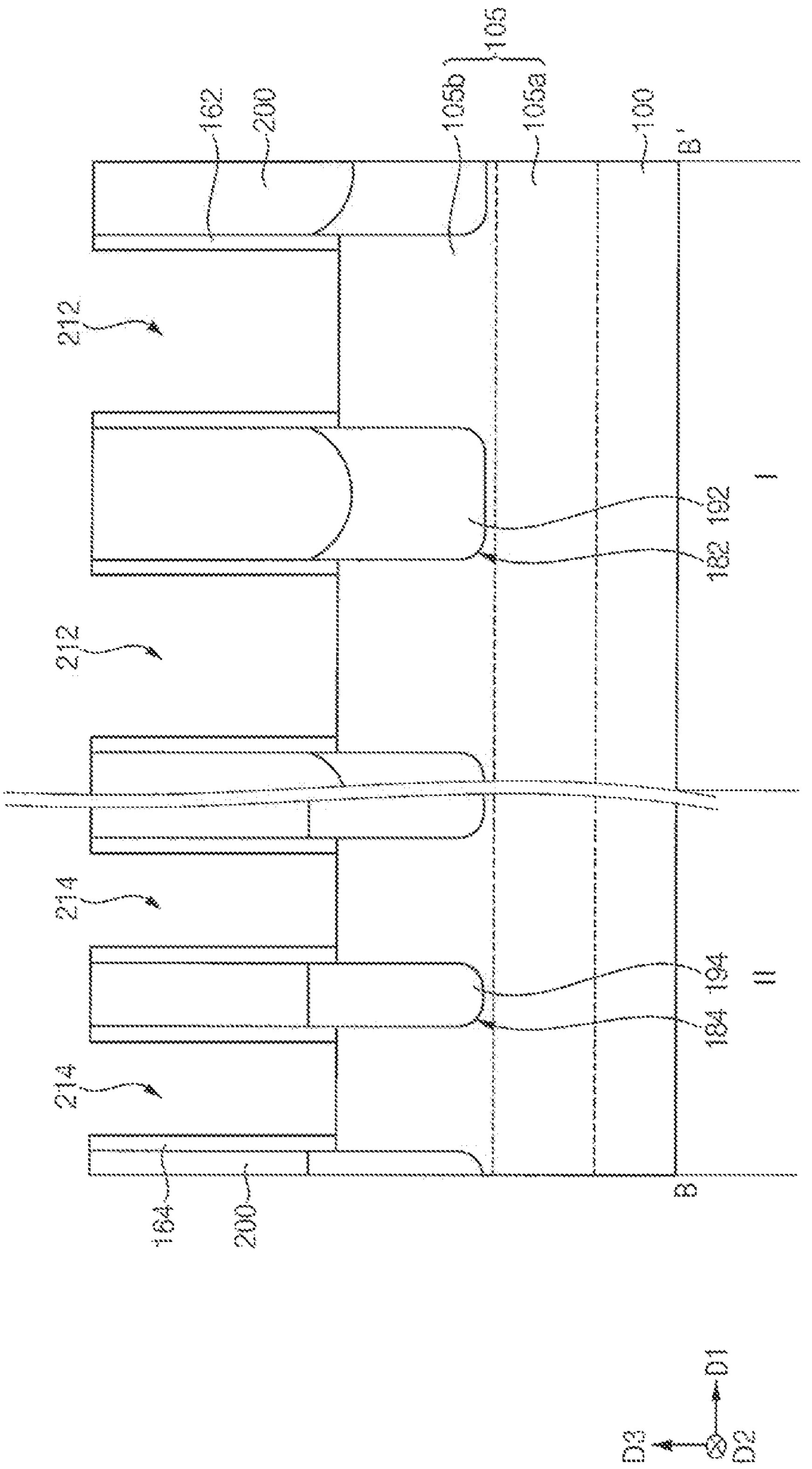

Referring to FIG. 11, a first insulating interlayer 200 may be formed on the substrate 100 having the first and second dummy gate structures 152 and 154, the first and second gate spacers 162 and 164, the fin spacer 170, the first and second source/drain layers 192 and 194 and the first isolation pattern 110 thereon to have an upper surface higher than upper surfaces of the first and second dummy gate structures 152 and 154 and the first and second gate spacers 162 and 164.

A planarization process may be performed until an upper surface of the first dummy gate electrode 130 included in each of the first and second dummy gate structures 152 and 154 is exposed to remove an upper portion of the first insulating interlayer 200 and the first dummy gate mask 140 included in each of the first and second dummy gate structures 152 and 154, and upper portions of the first and second gate spacers 162 and 164 may also be removed.

The first dummy gate electrode 130 and the first dummy gate insulation pattern 120 may be removed to form first and second openings 212 and 214 on the first and second regions I and II, respectively, of the substrate 100, which may expose upper surfaces of the first active pattern 105 and the first isolation pattern 110.

In example embodiments, the first dummy gate electrode 130 and the first dummy gate insulation pattern 120 may be removed by sequentially performing a dry etching process and a wet etching process. The wet etching process may be performed using, e.g., hydrofluoric acid (HF) as an etching solution.

Figure 12:
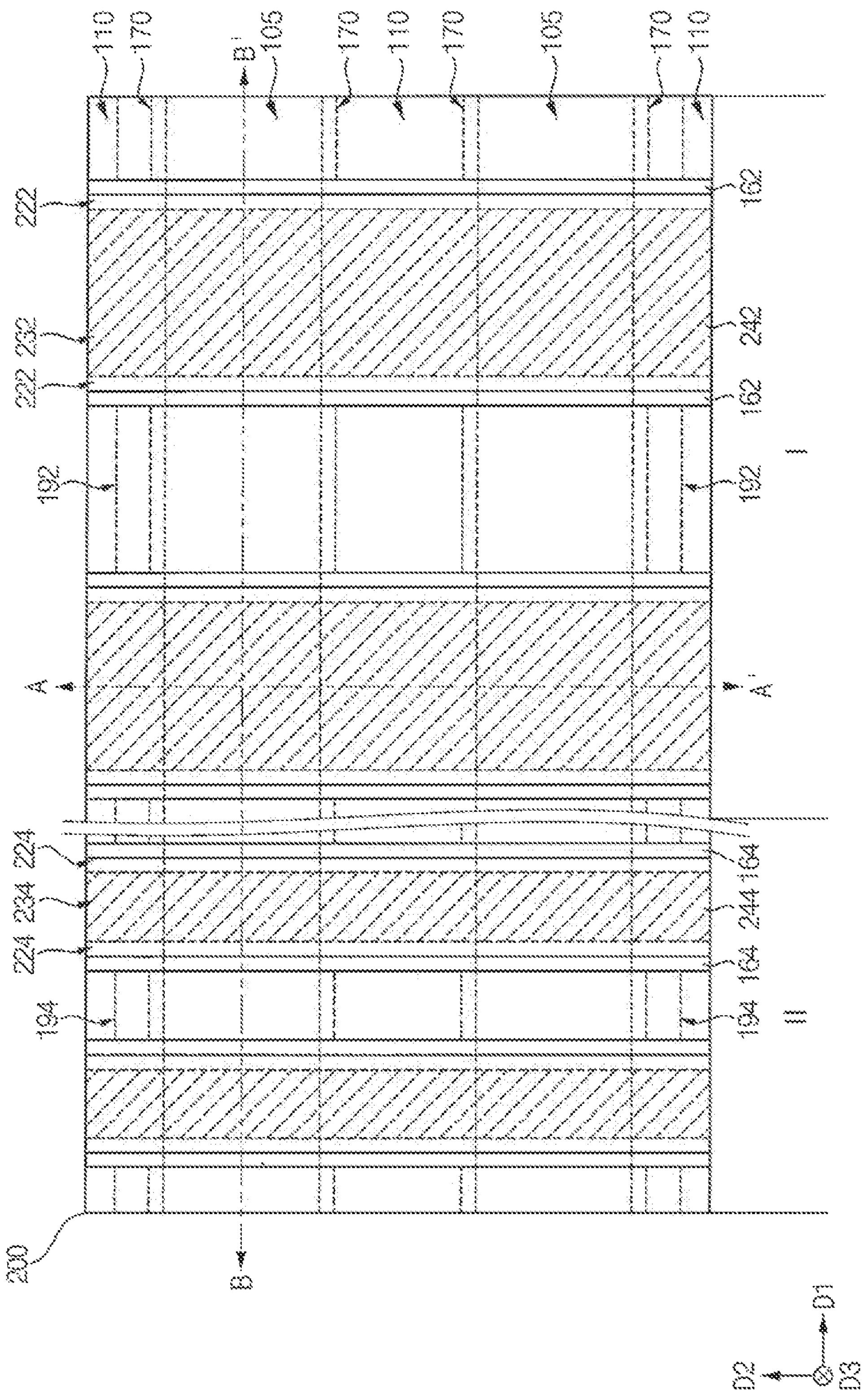
Figure 14:
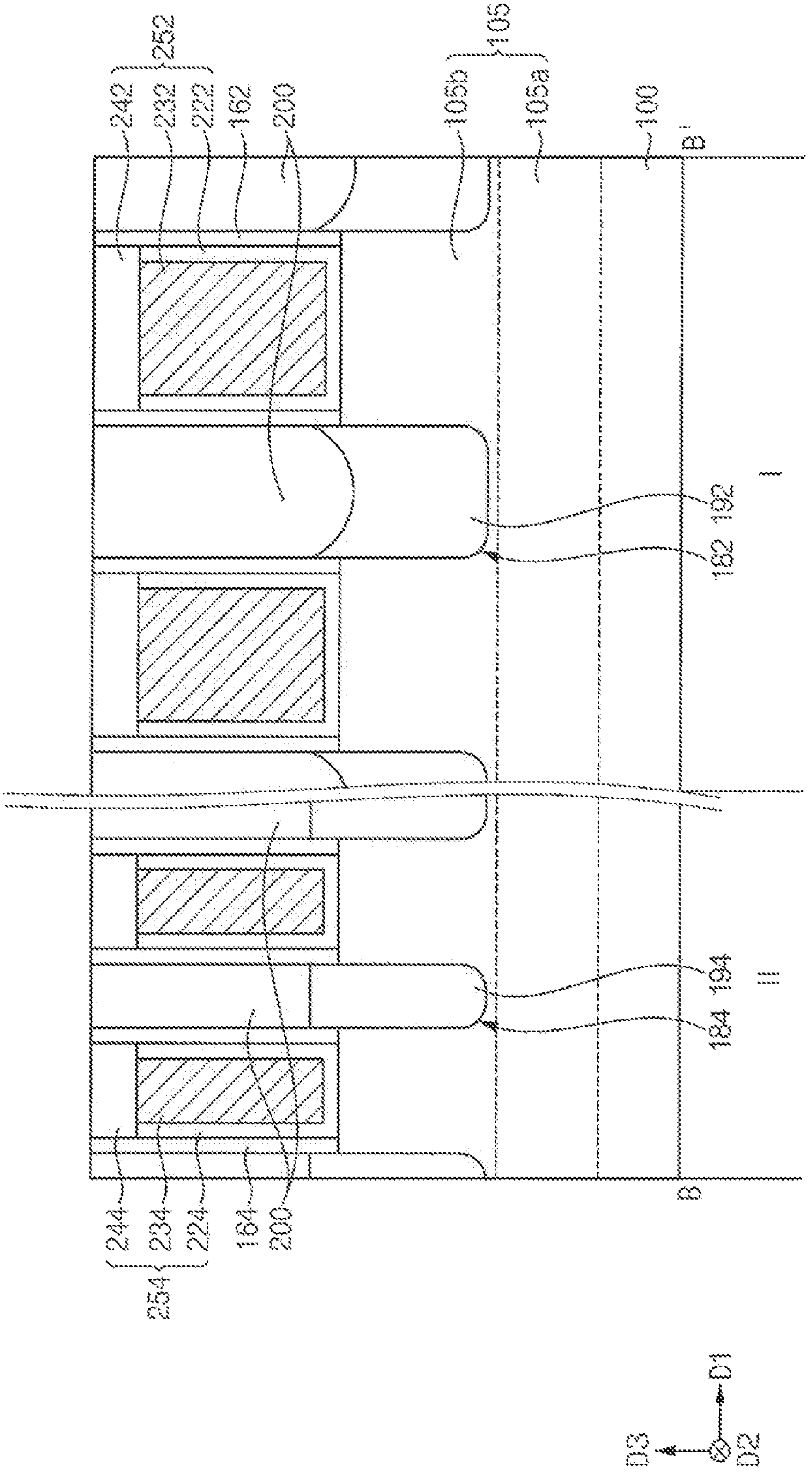

Referring to FIGS. 12 to 14, a first gate insulation layer may be formed bottoms and sidewalls of the first and second openings 212 and 214 and an upper surface of the first insulating interlayer 200, a first gate electrode layer may be formed on the first gate insulation layer to fill remaining portions of the first and second openings 212 and 214, and the first gate electrode layer and the first gate insulation layer may be planarized until the upper surface of the first insulating interlayer 200 is exposed.

Thus, a first gate insulation pattern 222 may be formed in the first opening 212 to cover a lower surface and a sidewall of the first gate electrode 232, and a second gate insulation pattern 224 may be formed in the second opening 214 to cover a lower surface and a sidewall of the second gate electrode 234.

In an example embodiment, the first gate electrode layer may include a barrier layer and a gate conductive layer, and in this case, each of the first and second gate electrodes 232 and 234 may include a bather pattern and a gate conductive pattern.

Upper portions of the first gate electrode 232 and the first gate insulation pattern 222 may be removed to form a third recess, and upper portions of the second gate electrode 234 and the second gate insulation pattern 224 may be removed to form a fourth recess. In example embodiments, first and second capping patterns 242 and 244 may be formed in the third and fourth recesses, respectively.

Thus, a first gate structure 252 including the first gate insulation pattern 222 on upper surfaces of the first active pattern 105 and the first isolation pattern 110 and a lower inner sidewall of the first gate spacer 162 in the first opening 212, the first gate electrode 232 on the first gate insulation pattern 222 in a lower portion of the first opening 212, and the first capping pattern 242 on the first gate insulation pattern 222 and the first gate electrode 232 in an upper portion of the first opening 212 and contacting an upper inner sidewall of the first gate spacer 162 may be formed on the first region I of the substrate 100.

In example embodiments, a second gate structure 254 including the second gate insulation pattern 224 on upper surfaces of the first active pattern 105 and the first isolation pattern 110 and a lower inner sidewall of the second gate spacer 164 in the second opening 214, the second gate electrode 234 on the second gate insulation pattern 224 in a lower portion of the second opening 214, and the second capping pattern 244 on the second gate insulation pattern 224 and the second gate electrode 234 in an upper portion of the second opening 214 and contacting an upper inner sidewall of the second gate spacer 164 may be formed on the second region II of the substrate 100.

Figure 15:
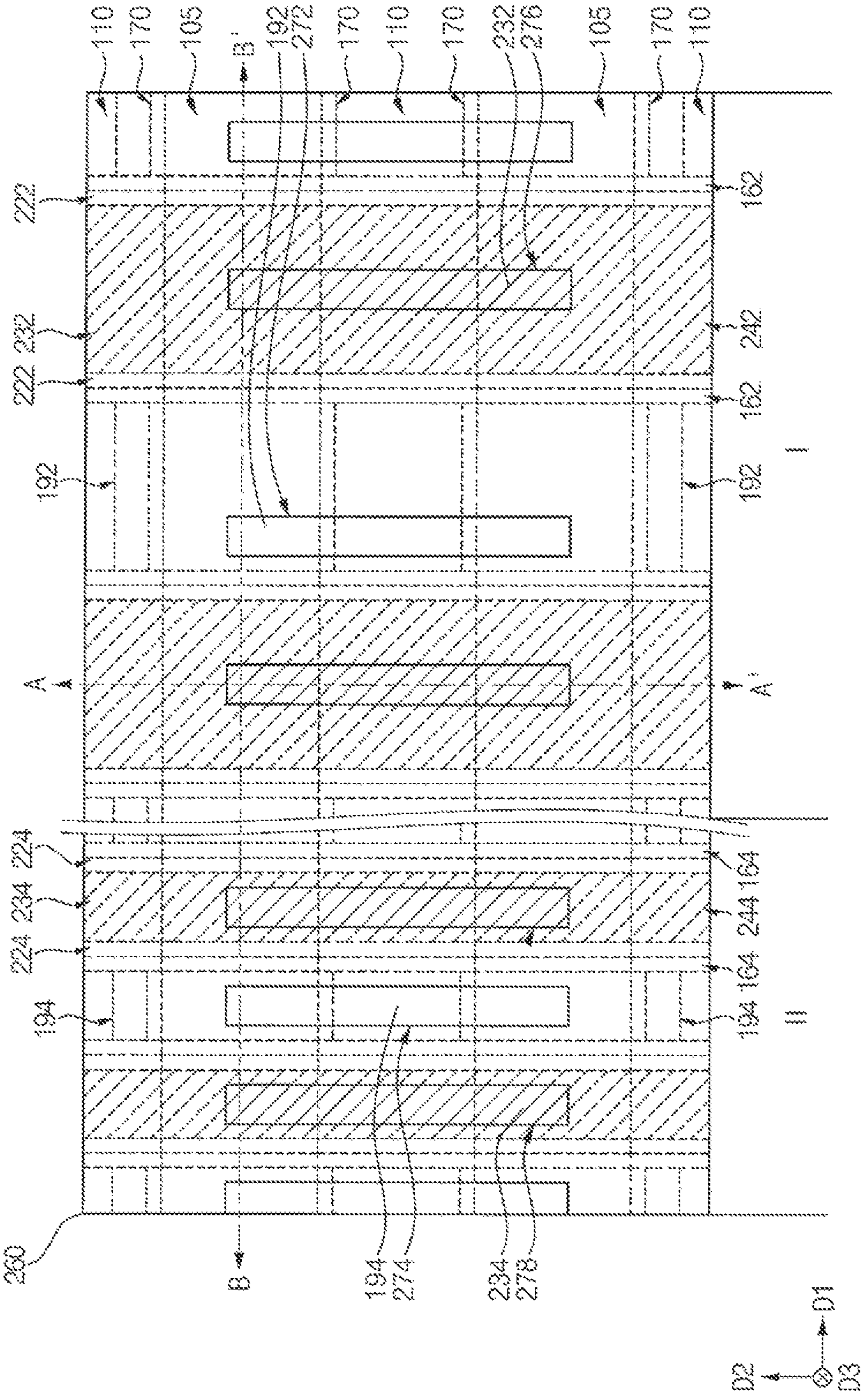
Figure 16:
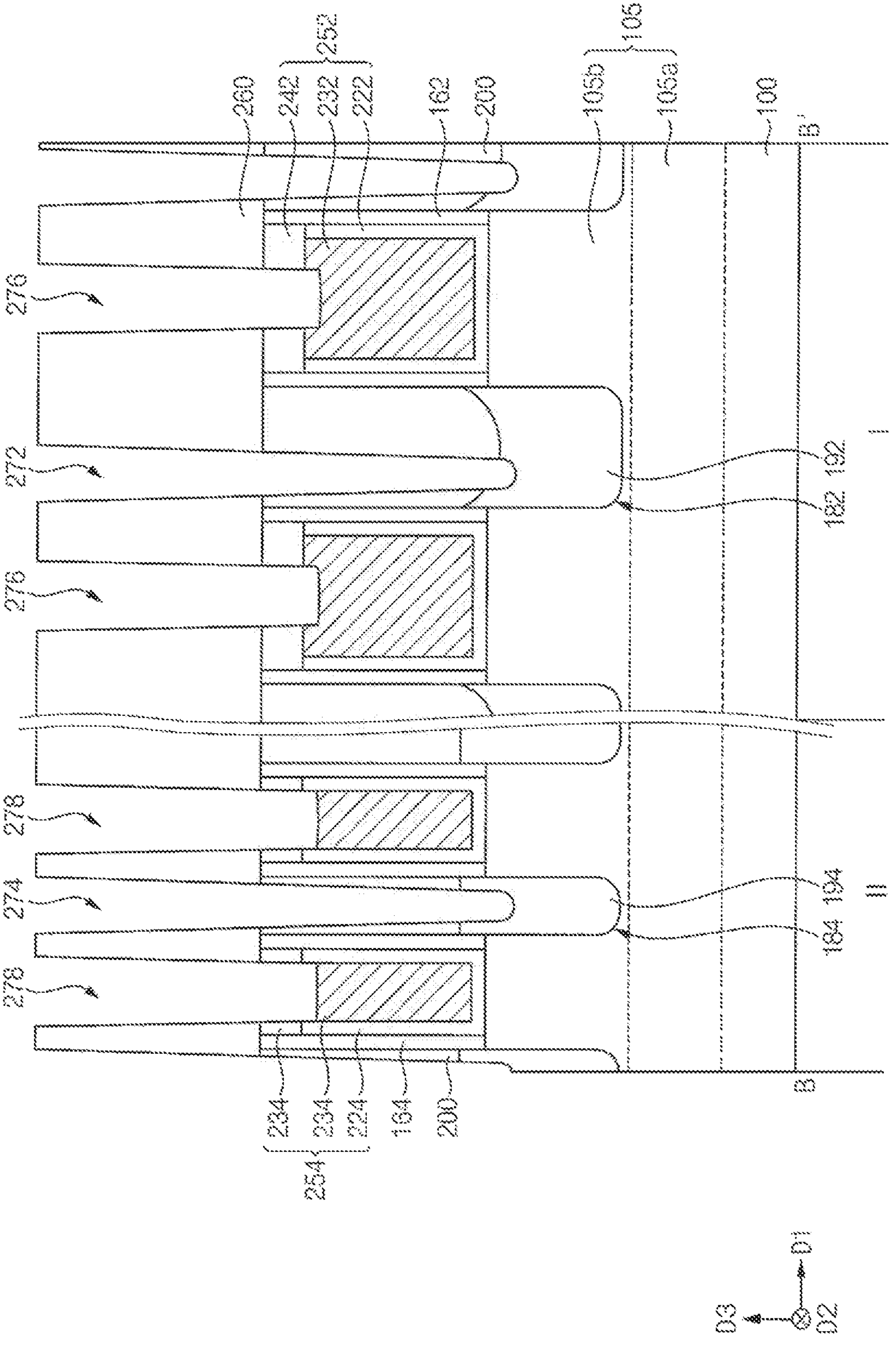

Referring to FIGS. 15 and 16, a second insulating interlayer 260 may be formed on the first and second gate structures 252 and 254, the first and second gate spacers 162 and 164, and the first insulating interlayer 200, and portions of the first and second insulating interlayers 200 and 260 between the first gate structures 252 may be partially removed to form a third opening 272 exposing an upper surface of the first source/drain layer 192, and portions of the first and second insulating interlayers 200 and 260 between the second gate structures 254 may be partially removed to form a fourth opening 274 exposing an upper surface of the second source/drain layer 194.

In example embodiments, the fourth opening 274 may be formed to expose a central portion in the first direction D1 of the upper surface of the second source/drain layer 194, while the third opening 272 may be formed to expose an edge portion in the first direction D1 of the upper surface of the first source/drain layer 192.

As described above, the second source/drain layer 194 may have the flat upper surface, while the first source/drain layer 192 may have the concave upper surface and the central portion in the first direction D1 of the upper surface of the first source/drain layer 192 may be lower than the edge portion in the first direction D1 of the upper surface of the first source/drain layer 192. Thus, if the third and fourth openings 272 and 274 are formed by the same etching process and the third opening 272 is formed toward the central portion of the upper surface of the first source/drain layer 192, the third opening 272 may not sufficiently extend to the central portion of the upper surface of the first source/drain layer 192 so that the upper surface of the first source/drain layer 192 may not be exposed.

If the third opening 272 is formed to have a depth enough to expose the upper surface of the first source/drain layer 192, the third opening 272, which may be formed by the same etching process as the fourth opening 274, may also have a deep depth so that an amount of the second source/drain layer 194 removed by the etching process may be excessively large. Thus, an amount of stress that may be applied to the first active pattern 105 through the second source/drain layer 194 may be less than the desired amount of stress.

However, in example embodiments, the third opening 272 may be formed toward the edge portion of the upper surface of the first source/drain layer 192, and the edge portion of the upper surface of the first source/drain layer 192 is higher than the central portion thereof, so that the third opening 272 may sufficiently expose the edge portion of the upper surface of the first source/drain layer 192 even though the third and fourth openings 272 and 274 are formed by the same etching process. In some example embodiments, the third opening 272 may be formed such that a center of the third opening 272 is offset from a center of the upper surface of the first source/drain layer 192.

In example embodiments, after or before forming the third and fourth openings 272 and 274, and additional etching process may be performed so that the second insulating interlayer 260 and the first capping pattern 242 included in the first gate structure 252 may be partially removed to form a fifth opening 276 exposing an upper surface of the first gate electrode 232, and that the second insulating interlayer 260 and the second capping pattern 244 included in the second gate structure 254 may be partially removed to form a sixth opening 278 exposing an upper surface of the second gate electrode 234.

Referring to FIGS. 1 to 4 again, first and second contact plugs 282 and 284 filling the third and fourth openings 272 and 274, respectively, and third and fourth contact plugs 286 and 288 filling the fifth and sixth openings 276 and 278, respectively, may be formed to complete the fabrication of the semiconductor device.

As described above, when the first and second source/drain layers 192 and 194 are formed in the first recess 182 having a relatively width and in second recess 184 having a relatively small width, respectively, the first source/drain layer 192 may have the concave upper surface in which the central portion is lower than the edge portion while the second source/drain layer 194 may have the flat upper surface. Thus, when the first and second insulating interlayers 200 and 260 are etched by the same etching process to form the third and fourth openings 272 and 274, even though the fourth source/drain layer 194 may expose the upper surface of the second source/drain layer 194, the third opening 272 may not expose the upper surface of the first source/drain layer 192.

However, in example embodiments, the third opening 272 may be formed to expose not the central portion having a relatively low height but the edge portion having a relatively high height of the upper surface of the first source/drain layer 192. That is, the third opening 272 may be formed such that the center of the third opening 272 is offset from the center of the upper surface of the first source/drain layer 192. Thus, even though the third and fourth openings 272 and 274 are formed by the same etching process, the third and fourth openings 272 and 274 may sufficiently expose the upper surfaces of the first and second source/drain layers 192 and 194, respectively, and the first and second contact plugs 282 and 284 in the third and fourth openings 272 and 274, respectively, may contact the first and second source/drain layers 192 and 194, respectively. Accordingly, the contact failure and/or the contact resistance between the first and second contact plugs 282 and 284 and the first and second source/drain layers 192 and 194 may decrease, so that electrical signals may be well transferred through the first and second contact plugs 282 and 284.

Figure 17:
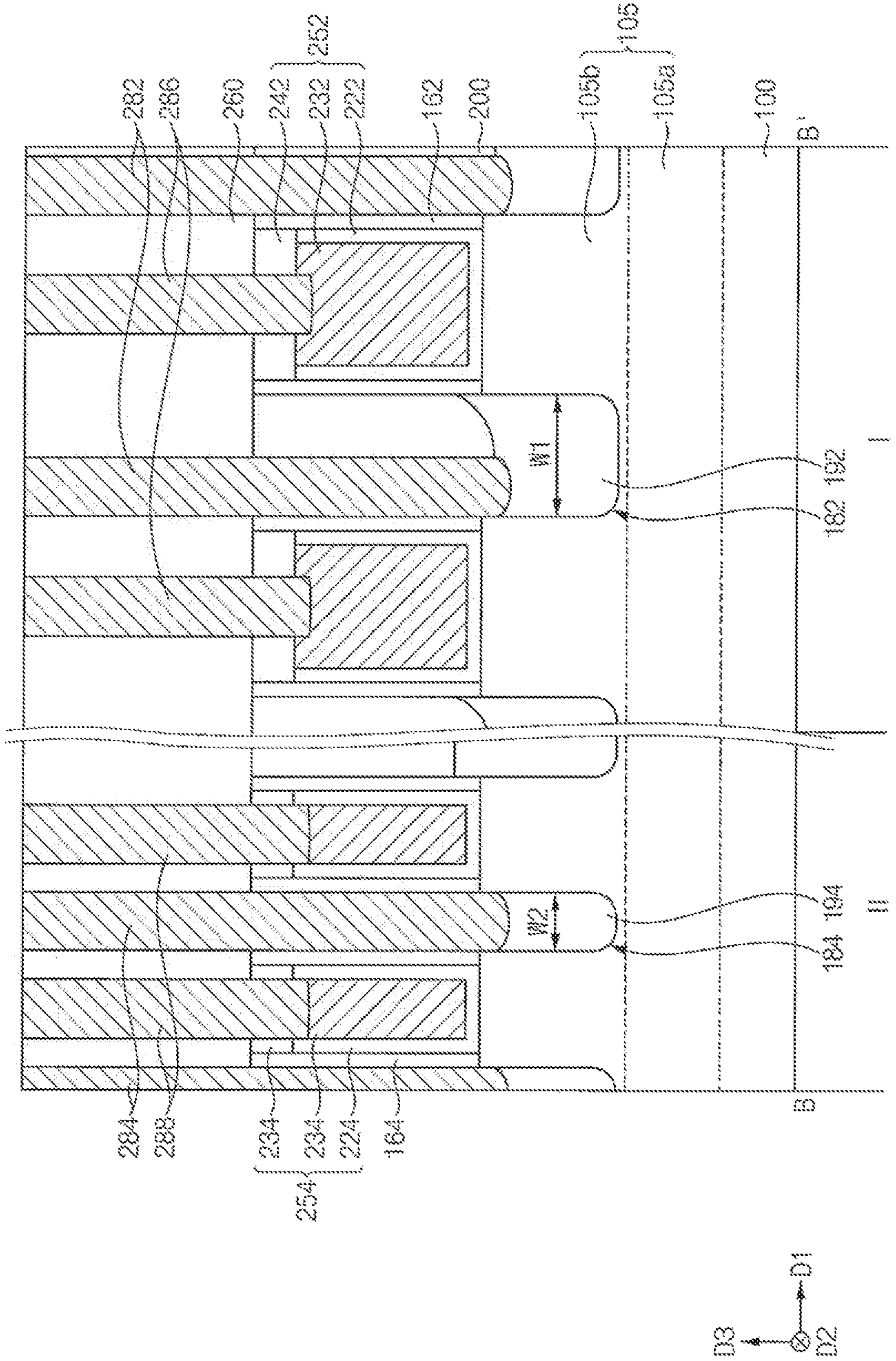
FIG. 17 is a cross-sectional view illustrating a semiconductor device in accordance with example embodiments.

FIG. 17 is a cross-sectional view illustrating a semiconductor device in accordance with example embodiments, and may correspond to FIG. 3.

This semiconductor device may be substantially the same as or similar to that of FIGS. 1 to 4, except for the positions of the first and second contact plugs and the first and second gate spacers, and thus repeated explanations thereof are omitted herein for conciseness.

Referring to FIG. 17, the second contact plug 284 may contact both of the second gate spacers 164 at opposite sides, respectively, in the first direction D1, and the first contact plug 282 may contact one of the first gate spacers 162 at opposite sides, respectively, in the first direction D1. In some example embodiments, the first contact plug 282 may contact only one of the first gate spacers 162 at opposite sides, respectively, in the first direction D1. That is, the second contact plug 284 may be self-aligned with both of the second gate spacers 164, and the first contact plug 282 may be self-aligned with one of the first gate spacers 162.

Figure 18:
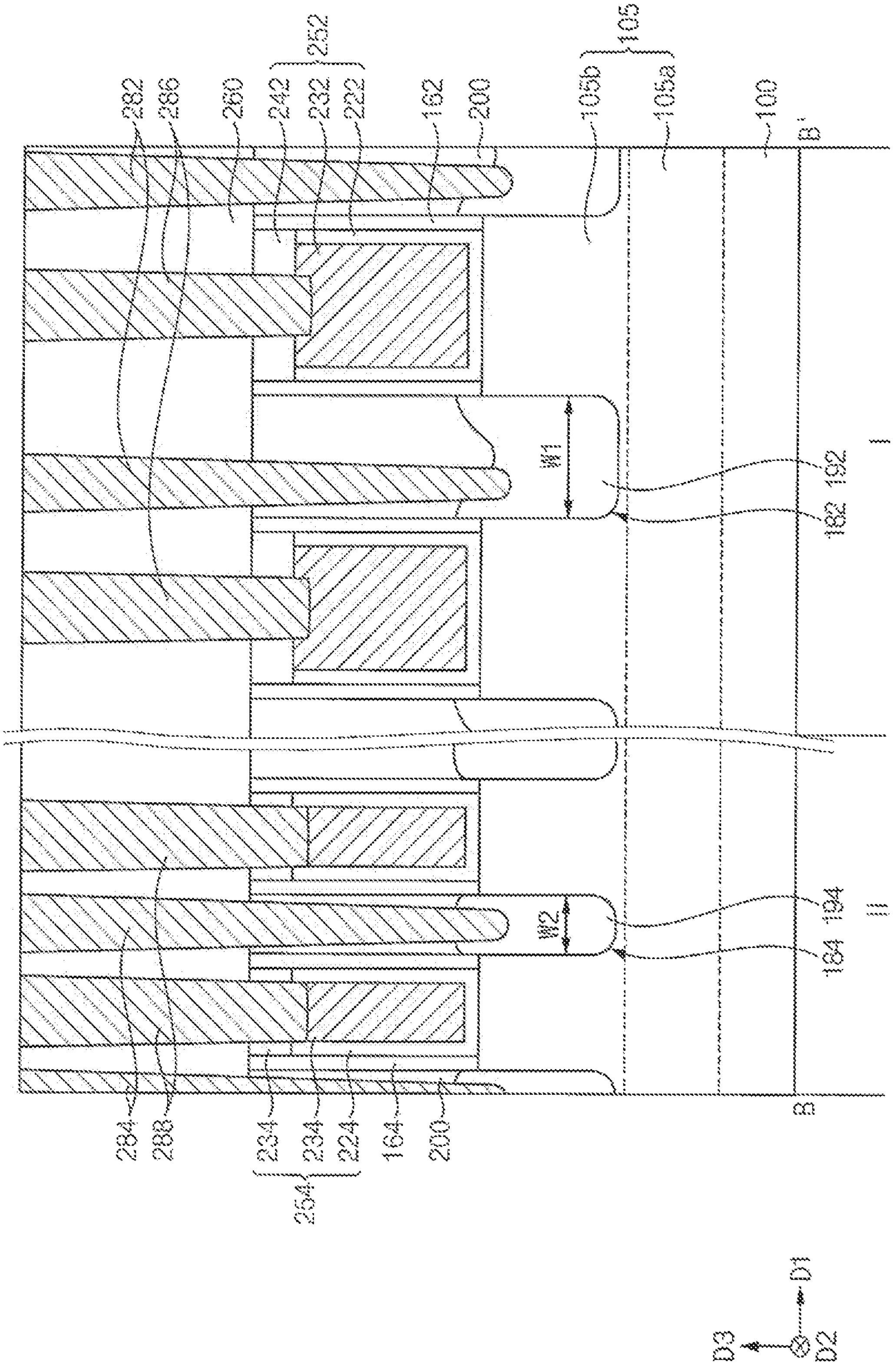
FIG. 18 is a cross-sectional view illustrating a semiconductor device in accordance with example embodiments.

FIG. 18 is a cross-sectional view illustrating a semiconductor device in accordance with example embodiments, and may correspond to FIG. 3.

This semiconductor device may be substantially the same as or similar to that of FIGS. 1 to 4, except for the shapes of the first and second source/drain layers 192 and 194, and thus repeated explanations thereof are omitted herein for conciseness.

Referring to FIG. 18, a slope of the upper surface of the first source/drain layer 192 with respect to the upper surface of the substrate 100 may gradually increase from the central portion to a given portion between the central portion and the edge portion, and then may gradually decrease from the given portion to the edge portion.

The upper surface of the second source/drain layer 194 may have a convex shape, and thus a central portion of the upper surface of the second source/drain layer 194 may be higher than an edge portion thereof.

Figure 19:
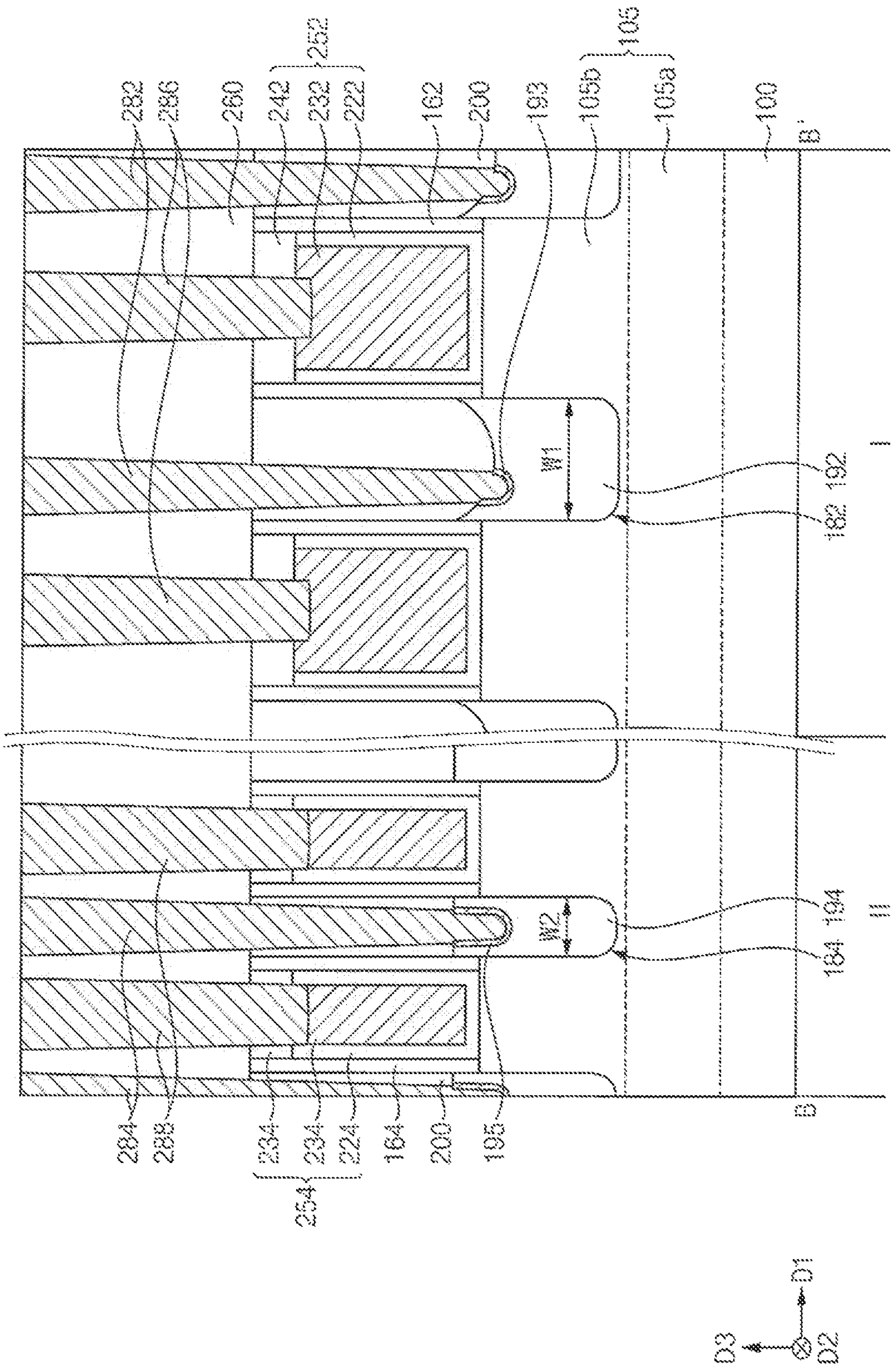
FIG. 19 is a cross-sectional view illustrating a semiconductor device in accordance with example embodiments.

FIG. 19 is a cross-sectional view illustrating a semiconductor device in accordance with example embodiments, and may correspond to FIG. 3.

This semiconductor device may be substantially the same as or similar to that of FIGS. 1 to 4, except for further including a metal silicide pattern, and thus repeated explanations thereof are omitted herein for conciseness.

Referring to FIG. 19, a first metal silicide pattern 193 may be formed between the first contact plug 282 and the first source/drain layer 192, and a second metal silicide pattern 195 may be formed between the second contact plug 284 and the second source/drain layer 194.

Each of the first and second metal silicide patterns 193 and 195 may increase, e.g., cobalt silicide, nickel silicide, titanium silicide, etc.

Figure 20:
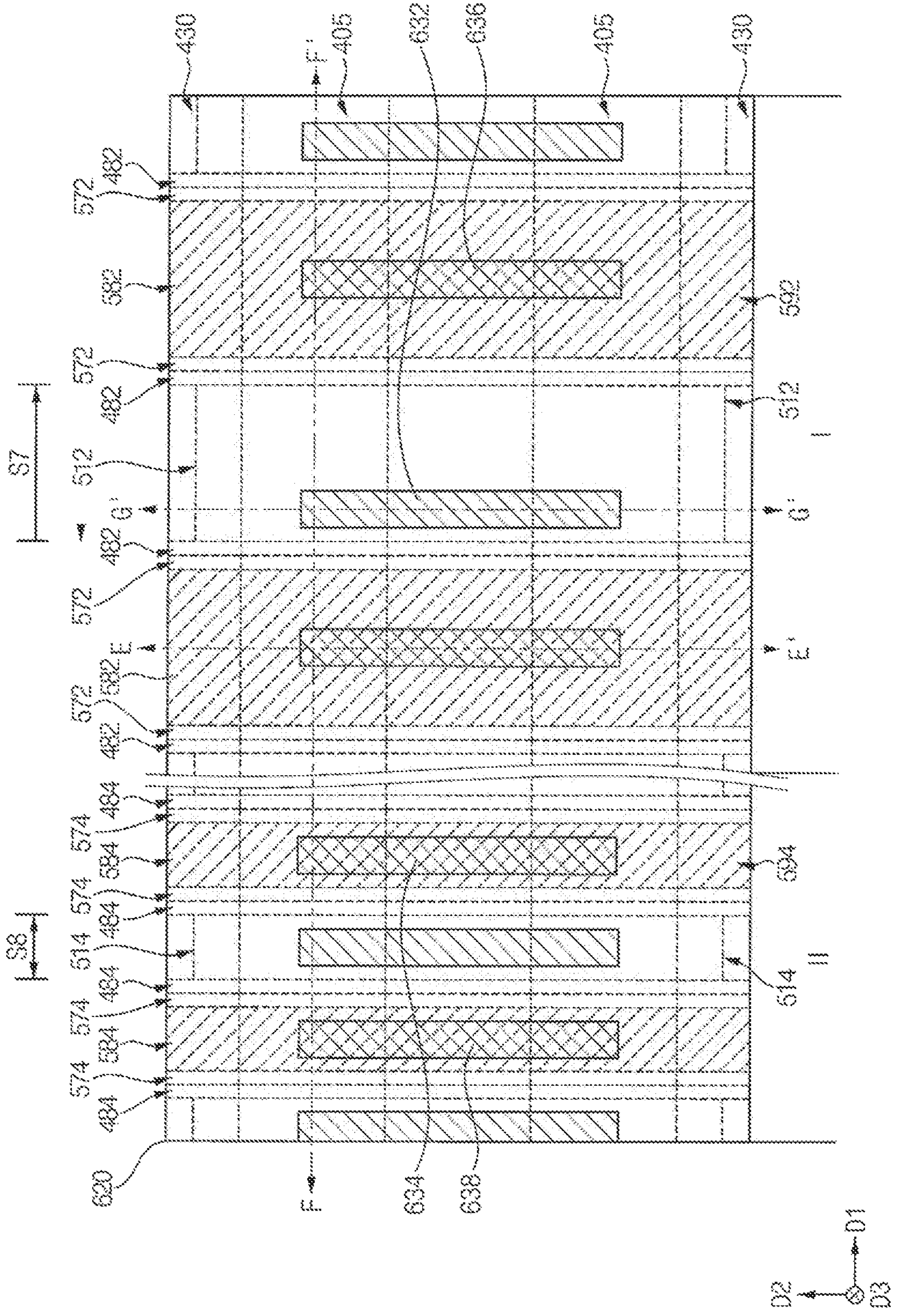
FIGS. 20 to 23 are a plan view and cross-sectional views illustrating a semiconductor device in accordance with example embodiments.
Figure 21:
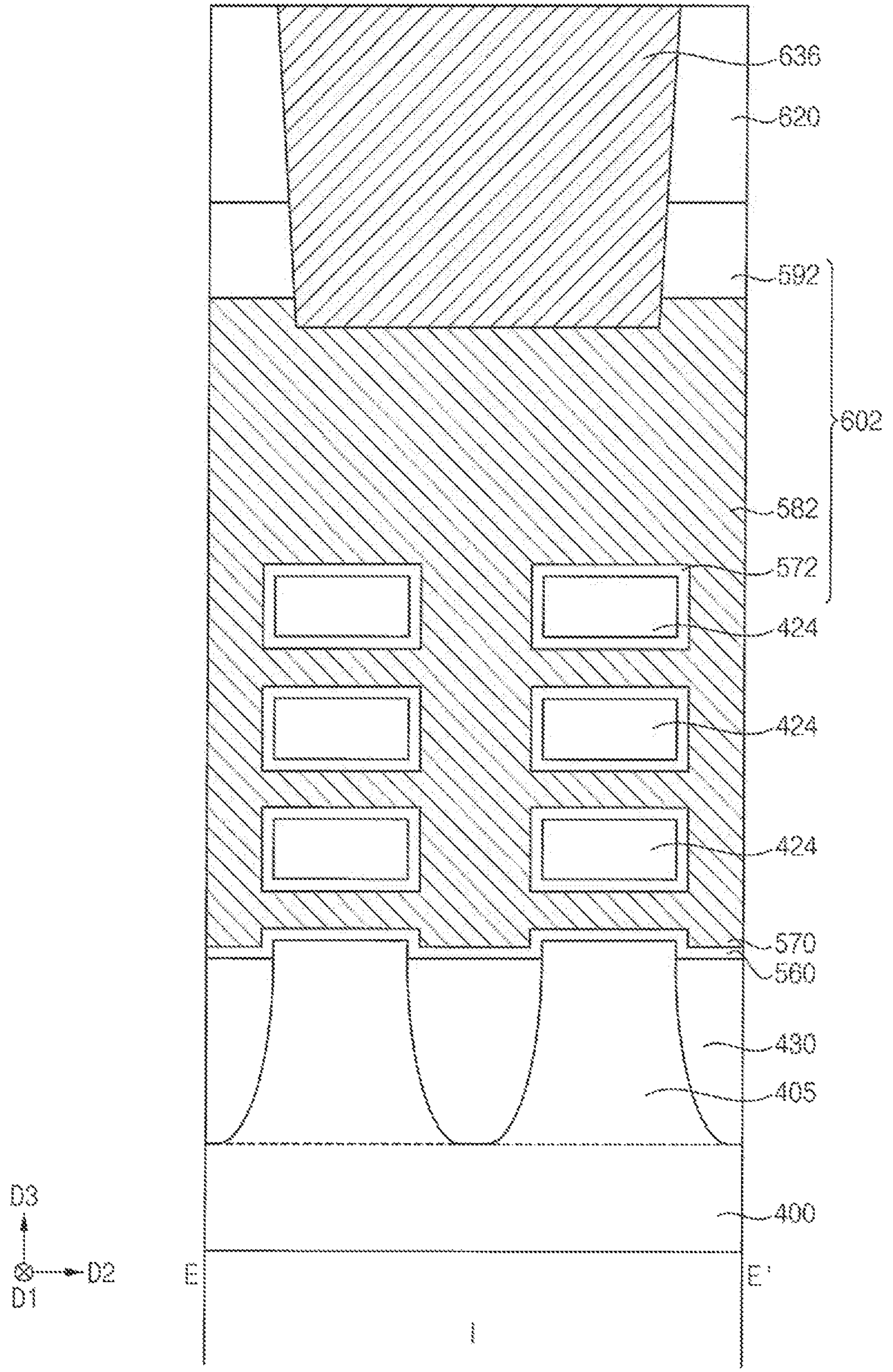
Figure 22:
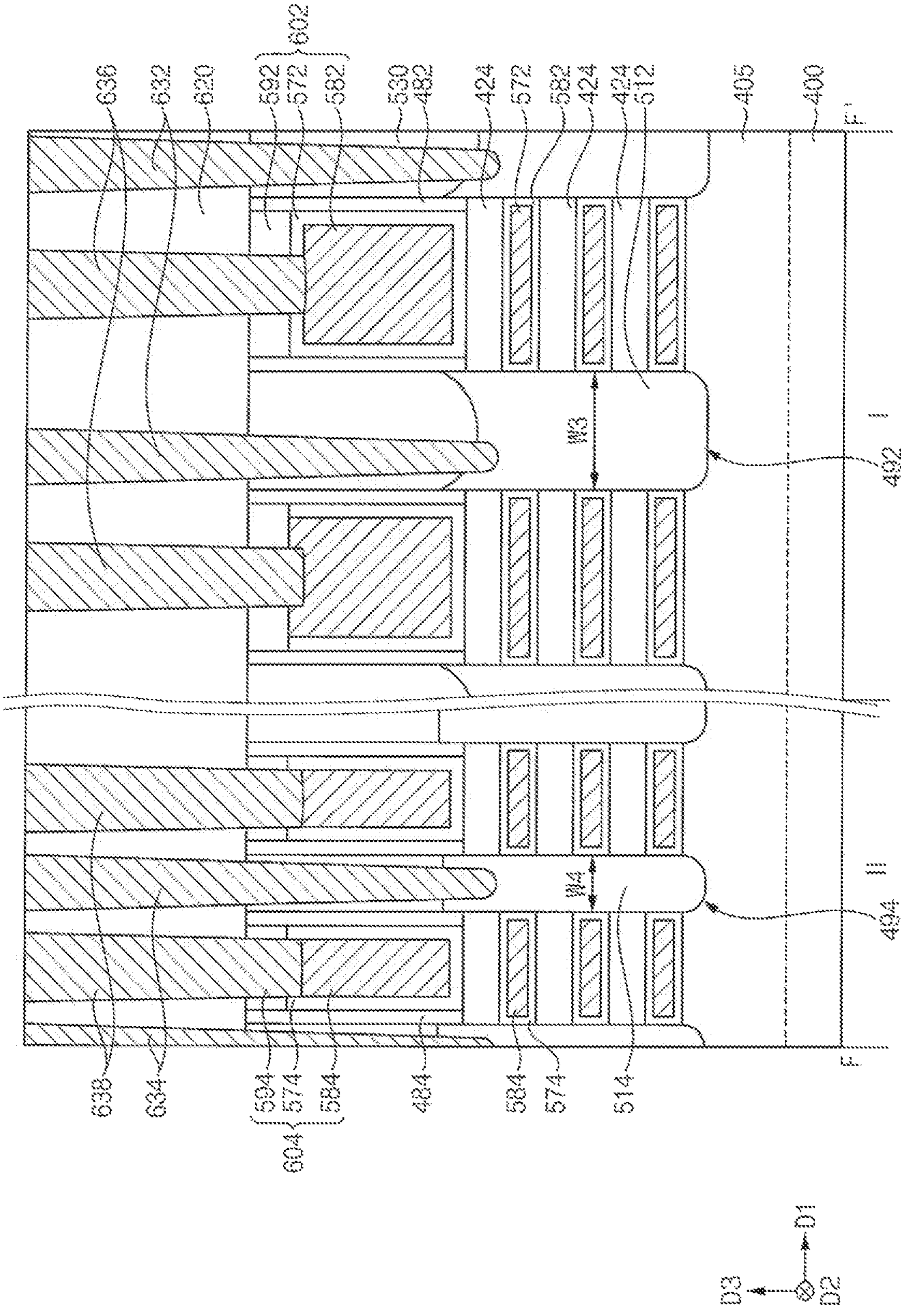
Figure 23:
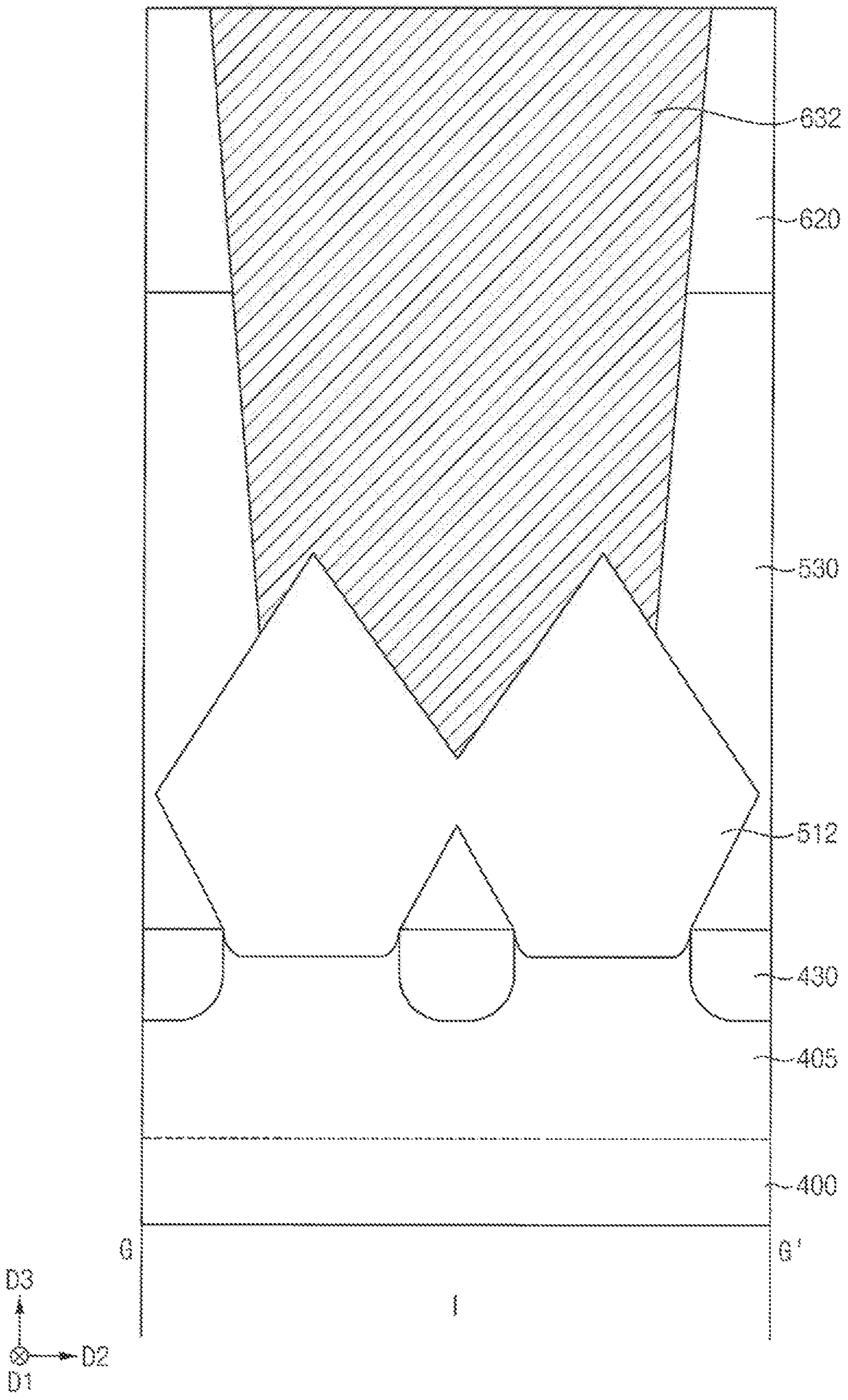

FIGS. 20 to 23 are a plan view and cross-sectional views illustrating a semiconductor device in accordance with example embodiments. Particularly, FIG. 20 is the plan view, FIG. 21 is a cross-sectional view taken along line E-E' of FIG. 20, FIG. 22 is a cross-sectional view taken along line F-F' of FIG. 20, and FIG. 23 is a cross-sectional view taken along line G-G' of FIG. 20.

This semiconductor device may include elements substantially the same as or similar to those illustrated with reference to FIGS. 1 to 4, and thus repeated explanations thereof are omitted herein for conciseness.

As illustrated below, the semiconductor device may be a multi-bridge channel field effect transistor (MBCFET) including semiconductor patterns 424 spaced apart from each other in the third direction D3 and serving as channels, respectively. Thus, other elements except for the semiconductor patterns 424 may have similar s and structures to corresponding elements included in the finFET of FIGS. 1 to 4.

Referring to FIGS. 20 to 23, the semiconductor device may include a second active pattern 405, a second isolation pattern 430, a third gate structure 602 and a fourth gate structure 604, the semiconductor patterns 424, a third source/drain layer 512 and a fourth source/drain layer 514, a third gate spacer 482 and a fourth gate spacer 484, a fifth contact plug 632, a sixth contact plug 634, a seventh contact plug 636, and an eighth contact plug 638, and a third insulating interlayer 530 and a fourth insulating interlayer 620 on a substrate 400.

The second active pattern 405 and the second isolation pattern 430 may correspond to the first active pattern 105 and the first isolation pattern 110, respectively, of FIGS. 1 to 4.

In example embodiments, a plurality of semiconductor patterns 424 may be formed at a plurality of levels, respectively, and may be spaced apart from each other in the third direction D3 from an upper surface of the second active pattern 405. Each of the plurality of semiconductor patterns 424 may extend in the first direction D1. FIGS. 21 and 22 show three semiconductor patterns 424 at three levels, respectively, however, example embodiments are not limited thereto.

In example embodiments, the semiconductor pattern 424 may be a nano-sheet or nano-wire including a semiconductor material, e.g., silicon, germanium, etc. In example embodiments, the semiconductor pattern 424 may serve as a channel in a transistor, and thus may also be referred to as a channel.

The third gate structure 602 and the third gate spacer 482 may correspond to the first gate structure 252 and the first gate spacer 162, respectively, of FIGS. 1 to 4, and the fourth gate structure 604 and the fourth gate spacer 484 may correspond to the second gate structure 254 and the second gate spacer 164, respectively, of FIGS. 1 to 4.

Thus, the third gate structure 602 may extend in the second direction D2 on the second active pattern 405 and the second isolation pattern 430, and may include a third gate insulation pattern 572 and a third gate electrode 582, and a third capping pattern 592 on the third gate insulation pattern 572 and the third gate electrode 582. In example embodiments, the fourth gate structure 604 may extend in the second direction D2 on the second active pattern 405 and the second isolation pattern 430, and may include a fourth gate insulation pattern 574 and a fourth gate electrode 584, and a fourth capping pattern 594 on the fourth gate insulation pattern 574 and the fourth gate electrode 584.

Each of the third and fourth gate structures 602 and 604 may surround a central portion in the first direction D1 of each of the semiconductor patterns 424, and may cover lower and upper surfaces and opposite sidewalls in the second direction D2 of each of the semiconductor patterns 424.

Thus, the third gate insulation pattern 572 may be formed on a surface of each semiconductor pattern 424, upper surfaces of the second active pattern 405 and the second isolation pattern 430, a sidewall of the third source/drain layer 512 and an inner sidewall of the third gate spacer 482, and each of the third gate electrode 582 may fill a space between the semiconductor patterns 424 spaced apart from each other in the third direction D3, a space between the second active pattern 405 and a lowermost one of the semiconductor pattern 424, and a space between the third gate spacers 482 on an uppermost one of the semiconductor patterns 424.

In example embodiments, the fourth gate insulation pattern 574 may be formed on a surface of each semiconductor pattern 424, upper surfaces of the second active pattern 405 and the second isolation pattern 430, a sidewall of the fourth source/drain layer 514 and an inner sidewall of the fourth gate spacer 484, and each of the fourth gate electrode 584 may fill a space between the semiconductor patterns 424 spaced apart from each other in the third direction D3, a space between the second active pattern 405 and a lowermost one of the semiconductor pattern 424, and a space between the fourth gate spacers 484 on an uppermost one of the semiconductor patterns 424.

In example embodiments, a seventh distance S7 between corresponding ones of the third gate spacers 482 in the first direction D1 on neighboring ones of the third gate structures 602, respectively, may be greater than an eighth distance S8 between corresponding ones of the fourth gate spacers 484 in the first direction D1 on neighboring ones of the fourth gate structures 604, respectively.

The third and fourth source/drain layers 512 and 514 may correspond to the first and second source/drain layers 192 and 194, respectively, of FIGS. 1 to 4. The third and fourth source/drain layers 512 and 514 may be formed in fifth and sixth recesses 492 and 494, respectively, on portions of the second active pattern 405 adjacent to the third and fourth gate structures 602 and 604, respectively, and a third width W3 in the first direction D1 of the third source/drain layer 512 in the fifth recess 492 may be greater than a fourth width W4 in the first direction D1 of the fourth source/drain layer 514 in the sixth recess 494.

In example embodiments, the third source/drain layer 512 may have a concave upper surface, and a central portion in the first direction D1 of the upper surface of the third source/drain layer 512 may be lower than an edge portion in the first direction D1 of the upper surface of the third source/drain layer 512. In example embodiments, the fourth source/drain layer 514 may have a flat upper surface, and may be higher than the central portion in the first direction D1 of the upper surface of the third source/drain layer 512.

The fifth to eighth contact plugs 632, 634, 636 and 638 may correspond to the first to fourth contact plugs 282, 284, 286 and 288 of FIGS. 1 to 4. Thus, the fifth and sixth contact plugs 632 and 634 may extend through the third and fourth insulating interlayers 530 and 620 to contact upper surfaces of the third and fourth source/drain layers 512 and 514, respectively, and the seventh and eighth contact plugs 636 and 638 may extend through the fourth insulating interlayer 620 to contact upper surfaces of the third and fourth gate electrodes 582 and 584, respectively, included in the third and fourth gate structures 602 and 604, respectively.

In example embodiments, the sixth contact plug 634 may contact a central portion in the first direction D1 of the upper surface of the fourth source/drain layer 514, and the fifth contact plug 632 may contact the edge portion in the first direction D1 of the upper surface of the third source/drain layer 512. Thus, even though the third source/drain layer 512 has the concave upper surface and the central portion of the upper surface of the third source/drain layer 512 is lower than the upper surface of the fourth source/drain layer 514, the fifth contact plug 632 may contact the edge portion of the upper surface of the third source/drain layer 512 having a relatively high height, so that the fifth contact plug 632 and the third source/drain layer 512 may contact each other well.

FIGS. 24 to 35 are plan views and cross-sectional views illustrating a method of manufacturing a semiconductor device in accordance with example embodiments. Particularly, FIGS. 24, 26, 29 and 33 are the plan views, and FIGS. 25, 27-28, 30-32 and 34-35 are the cross-sectional views.

Figure 25:
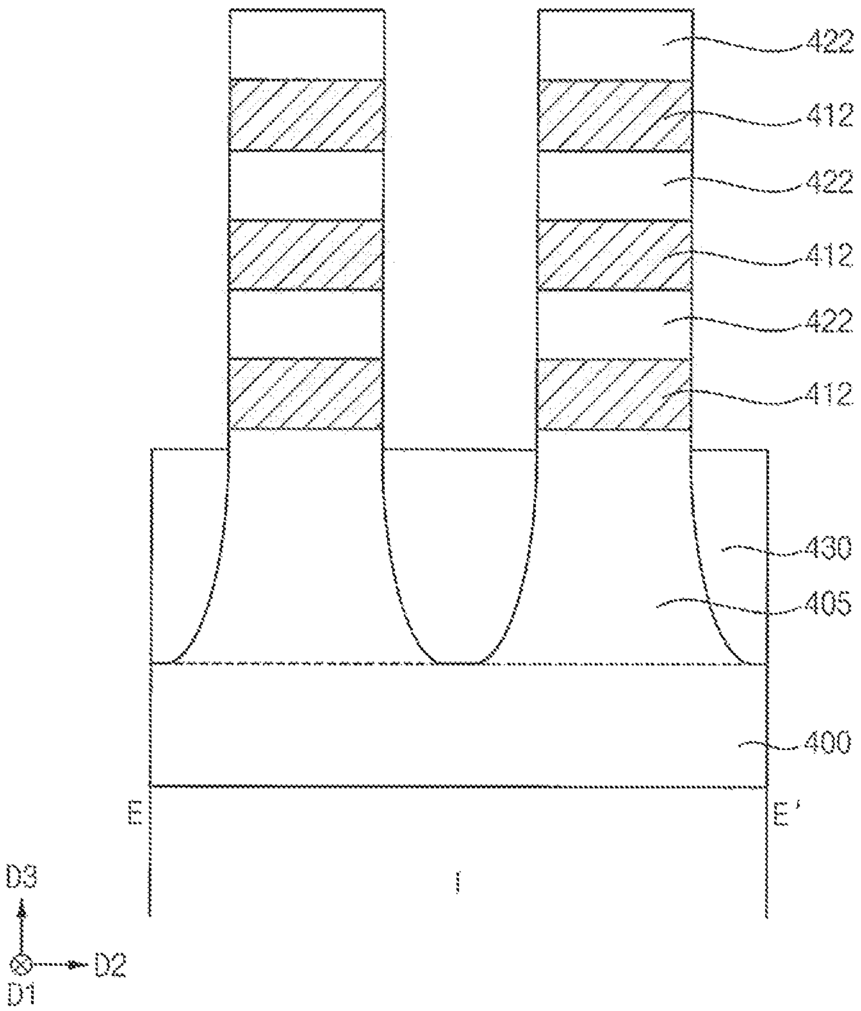
Figure 27:
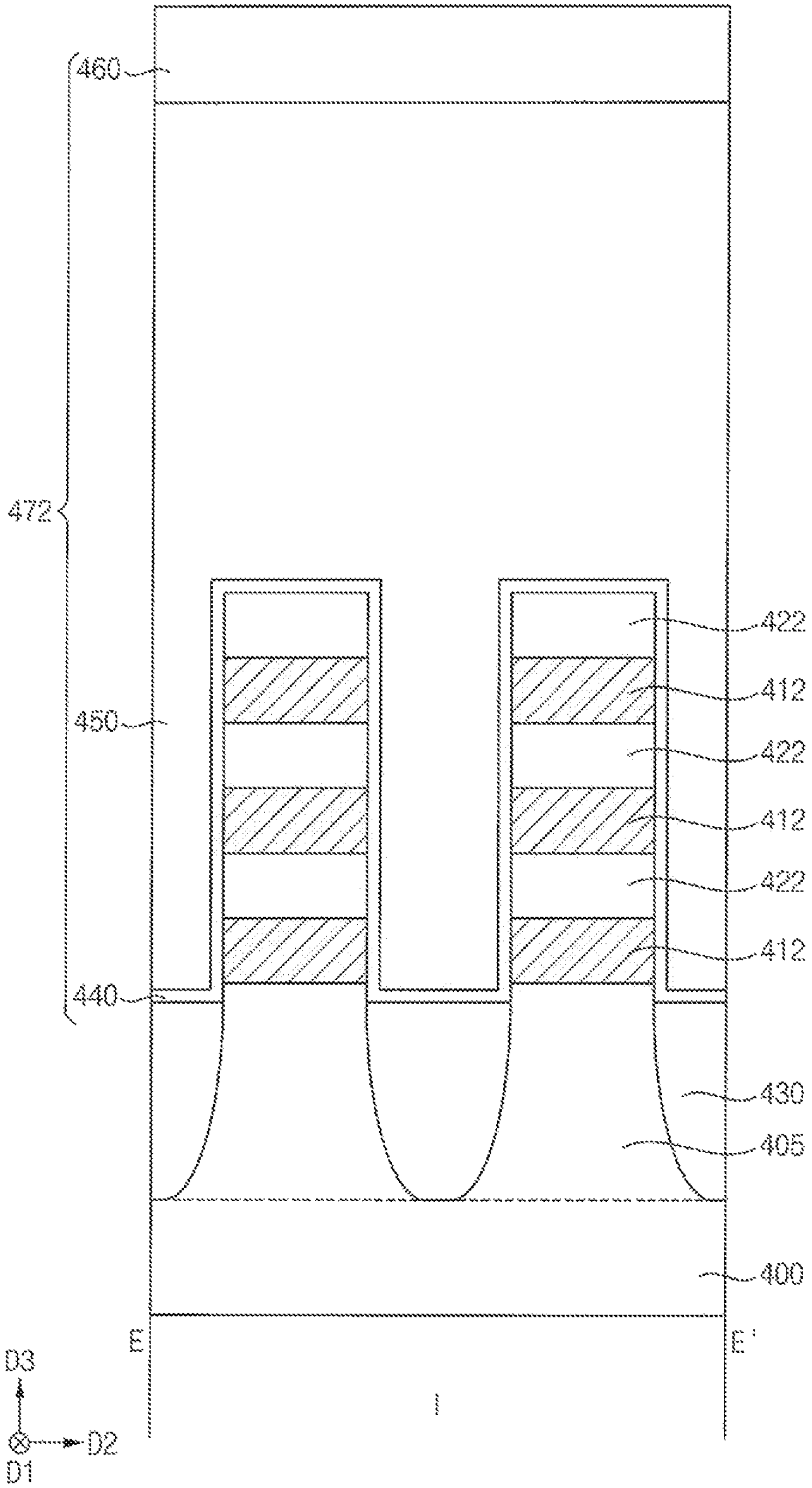
Figure 30:
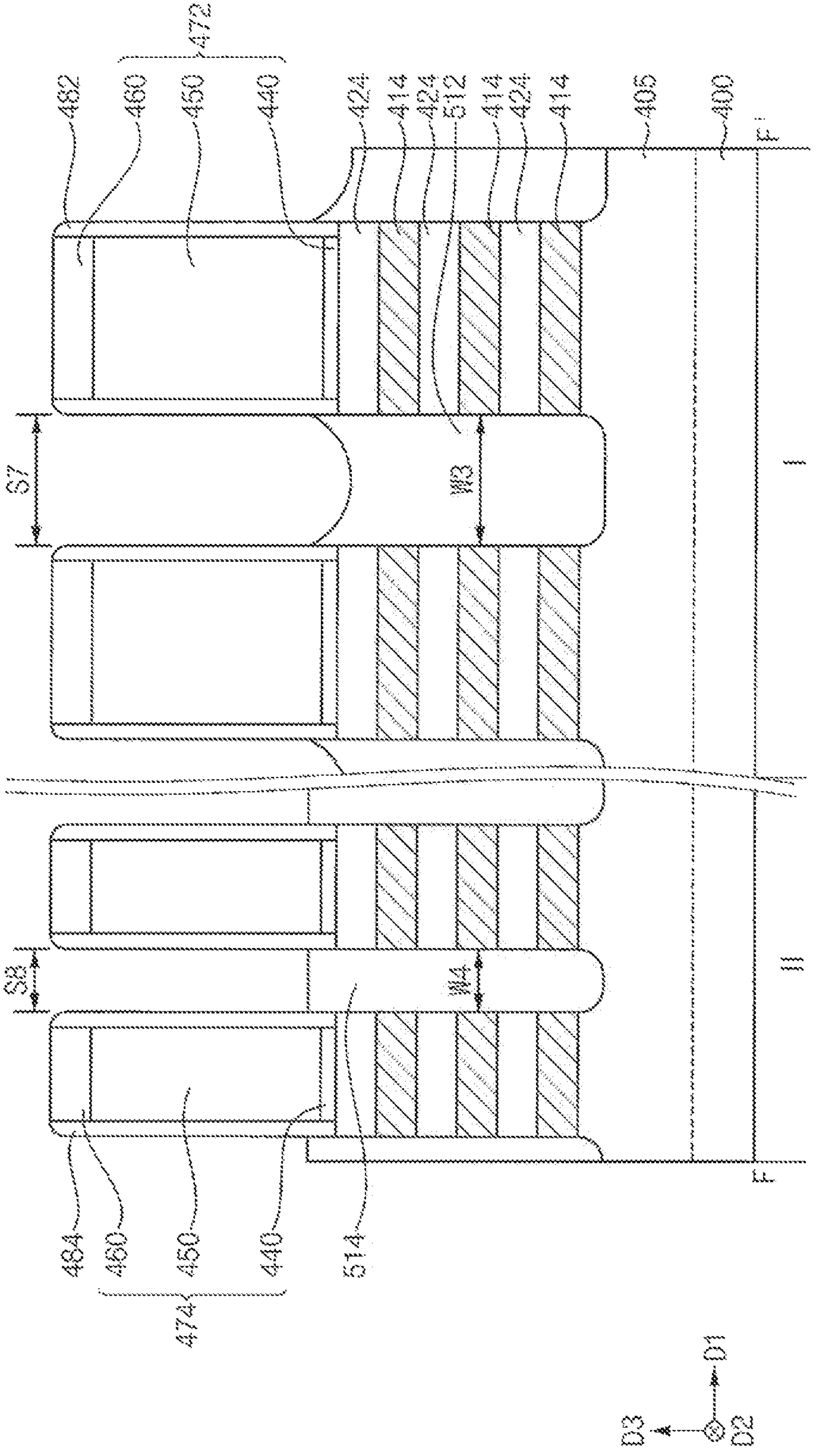
Figure 31:
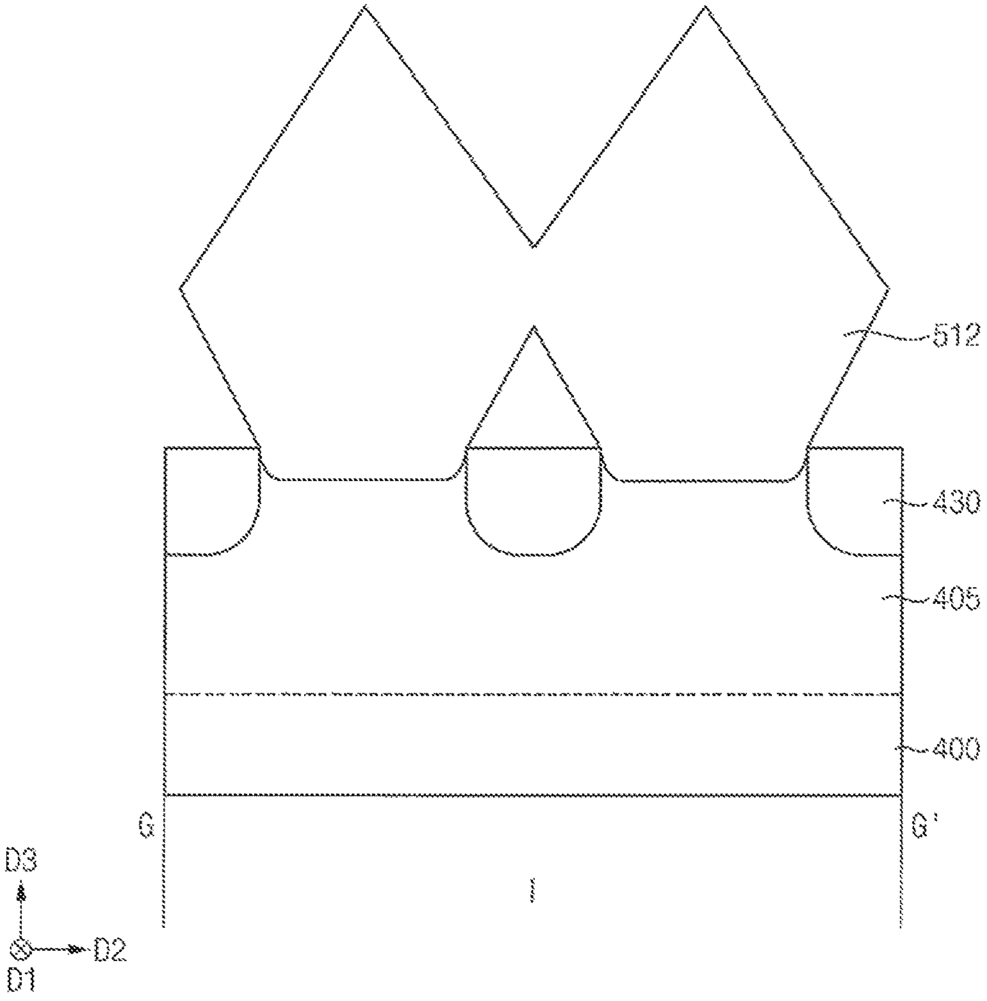
Figure 34:
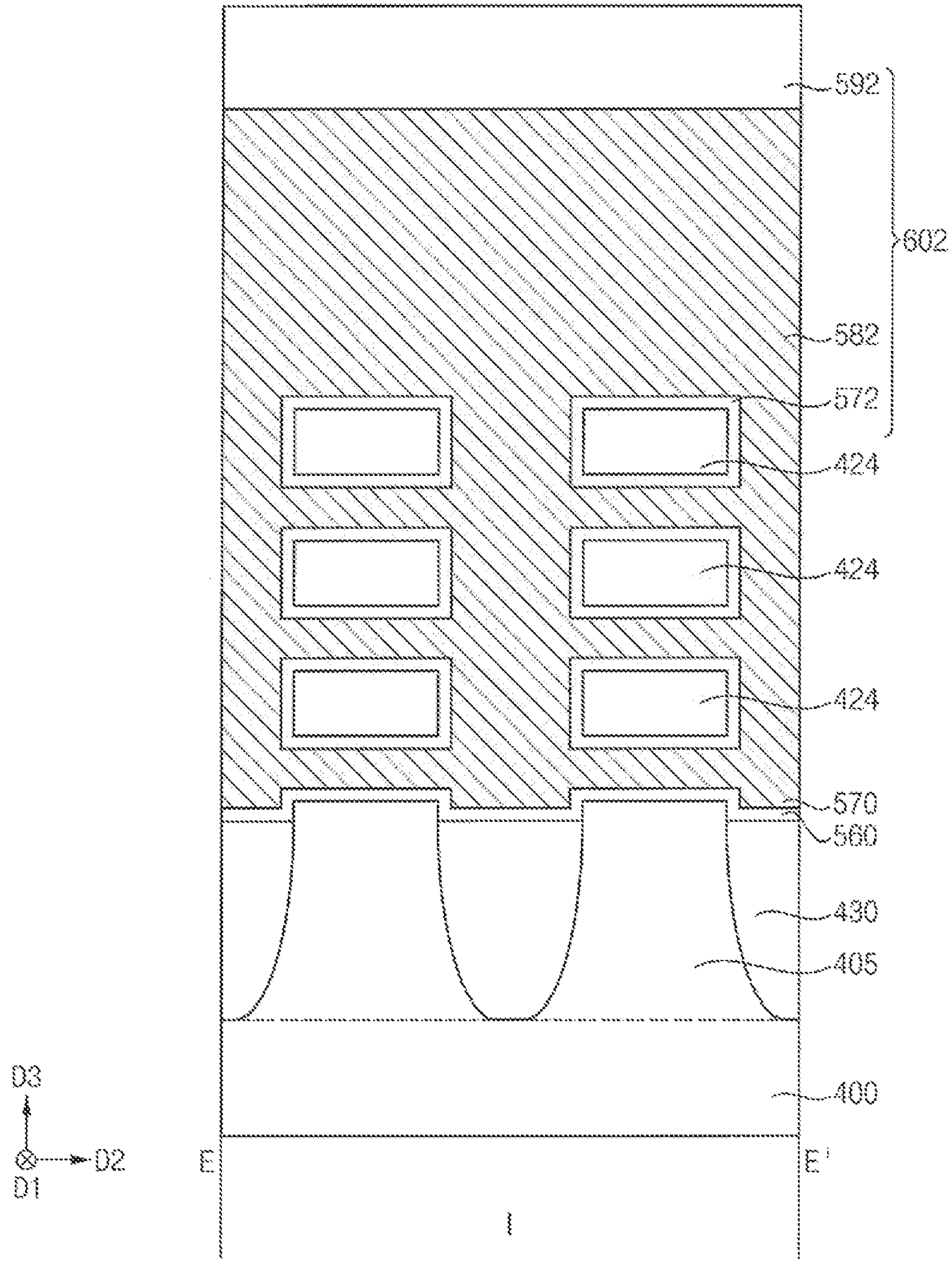

FIGS. 25, 27 and 34 are cross-sectional views taken along lines E-E' of corresponding plan views, respectively, FIGS. 28, 30, 32 and 35 are cross-sectional views taken along lines F-F' of corresponding plan views, respectively, and FIG. 31 is a cross-sectional view taken along line G-G' of a corresponding plan view.

This method may include processes substantially the same as or similar to those illustrated with reference to FIGS. 5 to 16 and FIGS. 1 to 4, and thus repeated explanations thereof are omitted herein for conciseness.

Figure 24:
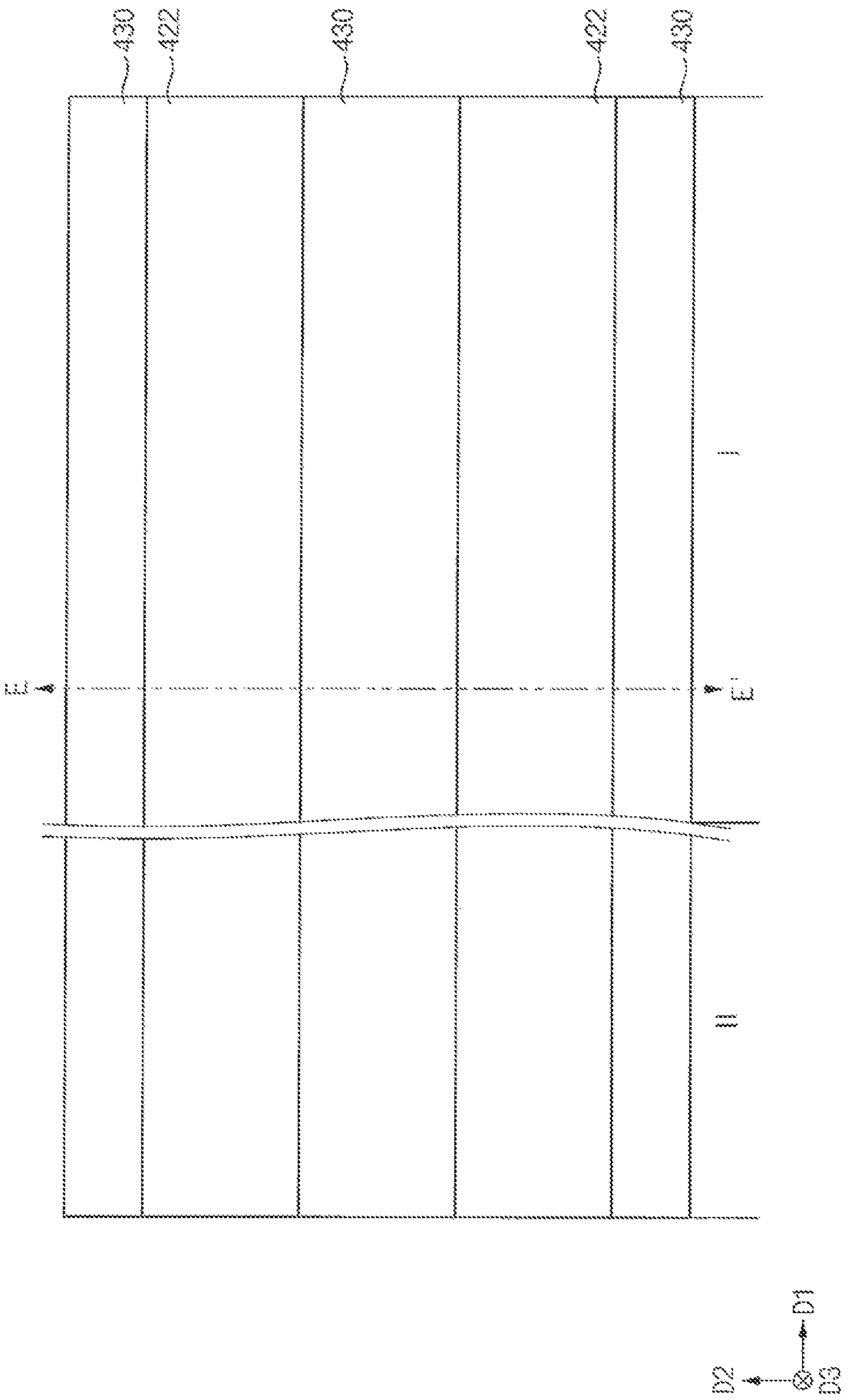
FIGS. 24 to 35 are plan views and cross-sectional views illustrating a method of manufacturing a semiconductor device in accordance with example embodiments.

Referring to FIGS. 24 and 25, a sacrificial layer and a semiconductor layer may be alternately and repeatedly stacked on a substrate 400, a first etching mask extending in the first direction D1 may be formed on an uppermost one of the semiconductor layers, and the semiconductor layers, the sacrificial layers and an upper portion of the substrate 400 may be etched using the third etching mask.

Thus, a second active pattern 405 extending in the first direction D1 may be formed on the substrate 400, and a fin structure including sacrificial lines 412 and semiconductor lines 422 alternately and repeatedly stacked in the third direction D3 may be formed on the second active pattern 405. In example embodiments, a plurality of fin structures may be spaced apart from each other in the second direction D2 on the substrate 400.

FIG. 25 shows three sacrificial lines 412 and three semiconductor lines 422 at three levels, respectively, however, example embodiments are not limited thereto. The sacrificial lines 412 may include a material having an etching selectivity with respect to the substrate 400 and the semiconductor lines 422, e.g., silicon-germanium.

A second isolation pattern 430 may be formed on the substrate 400 to cover a sidewall of the second active pattern 405.

Figure 26:
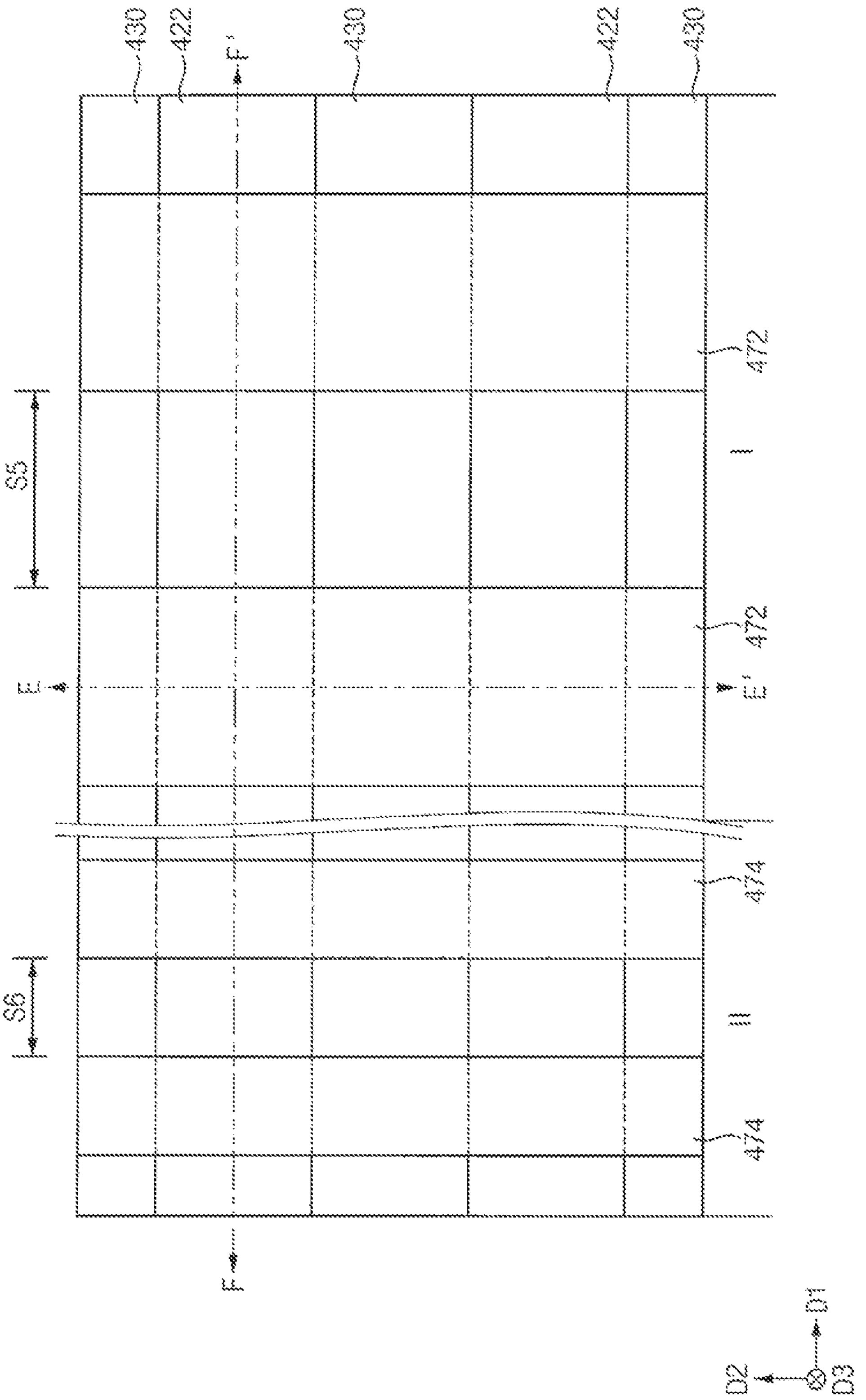
Figure 28:
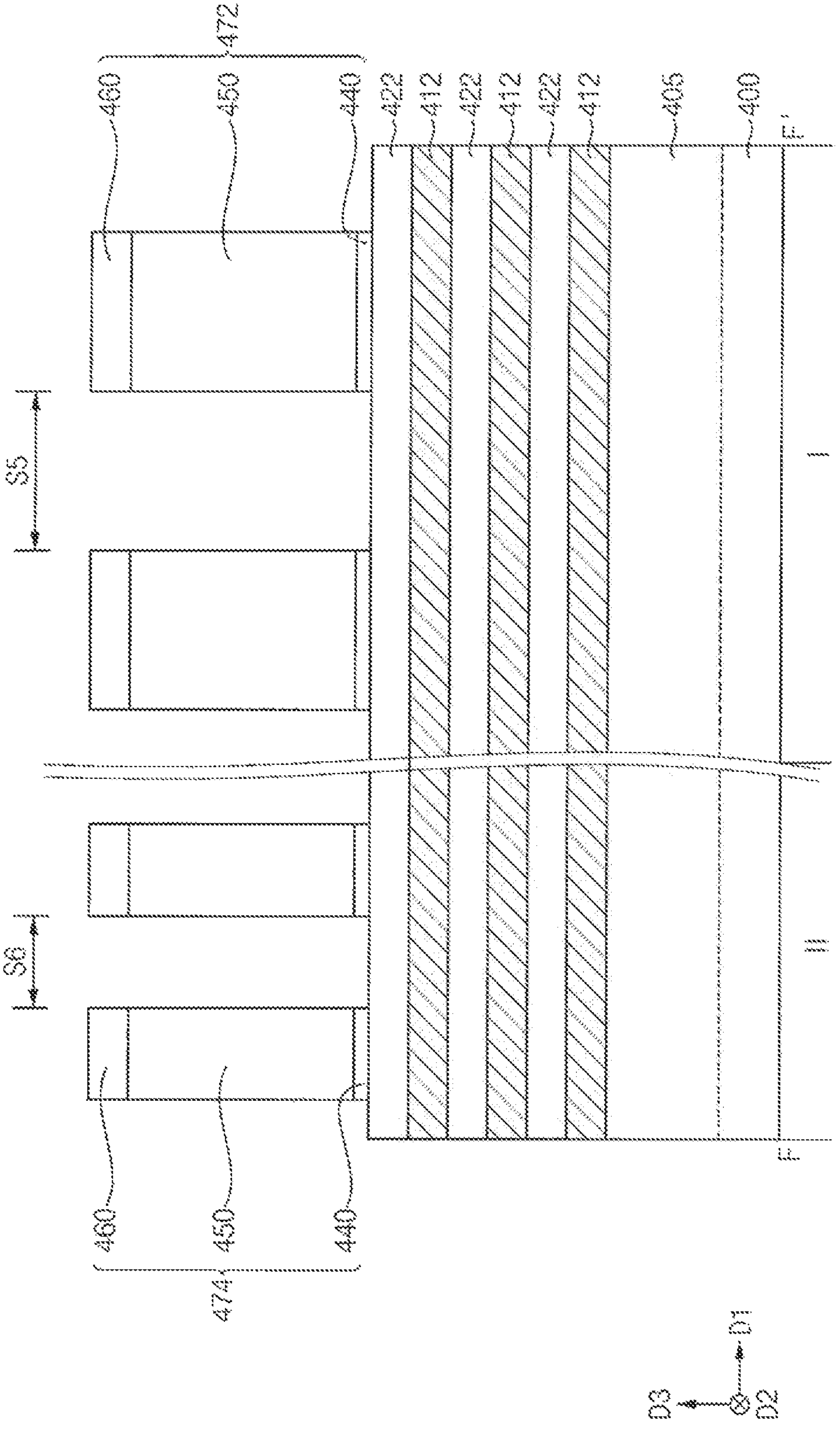

Referring to FIGS. 26 to 28, third and fourth dummy gate structures 472 and 474 may be formed on the first and second regions I and II, respectively, of the substrate 400 to partially cover the fin structure and the second isolation pattern 430.

Particularly, a second dummy gate insulation layer, a second dummy gate electrode layer and a second dummy gate mask layer may be sequentially formed on the substrate 400 having the fin structure and the second isolation pattern 430 thereon, a second etching mask extending in the second direction D2 may be formed on the second dummy gate mask layer, and the second dummy gate mask layer may be etched using the second etching mask to form a second dummy gate mask 460.

The second dummy gate electrode layer and the second dummy gate insulation layer may be etched using the second dummy gate mask 460 as an etching mask to form a second dummy gate electrode 450 and a second dummy gate insulation pattern 440, respectively, on the substrate 400.

The second dummy gate insulation pattern 440, the second dummy gate electrode 450 and the second dummy gate mask 460 sequentially stacked in the third direction D3 on the second active pattern 405 and a portion of the second isolation pattern 430 adjacent thereto on the first region I of the substrate 400 may form a third dummy gate structure 472, and the second dummy gate insulation pattern 440, the second dummy gate electrode 450 and the second dummy gate mask 460 sequentially stacked in the third direction D3 on the second active pattern 405 and a portion of the second isolation pattern 430 adjacent thereto on the second region II of the substrate 400 may form a fourth dummy gate structure 474.

In example embodiments, each of the third and fourth dummy gate structures 472 and 474 may extend in the second direction D2 on the fin structure and the second isolation pattern 430, and may cover an upper surface and opposite sidewalls in the second direction D2 of the fin structure.

In example embodiments, a plurality of third dummy gate structures 472 may be spaced apart from each other in the first direction D1 on the first region I of the substrate 400, and a plurality of fourth dummy gate structures 474 may be spaced apart from each other in the first direction D1 on the second region II of the substrate 400.

In example embodiments, a fifth distance S5 between neighboring ones of the third dummy gate structures 472 in the first direction D1 may be greater than a sixth distance S6 between neighboring ones of the fourth dummy gate structures 474 in the first direction D1. A width in the first direction D1 of the third dummy gate structure 472 may be greater than a width in the first direction D1 of the fourth dummy gate structure 474, however, example embodiments are not limited thereto.

Figure 29:
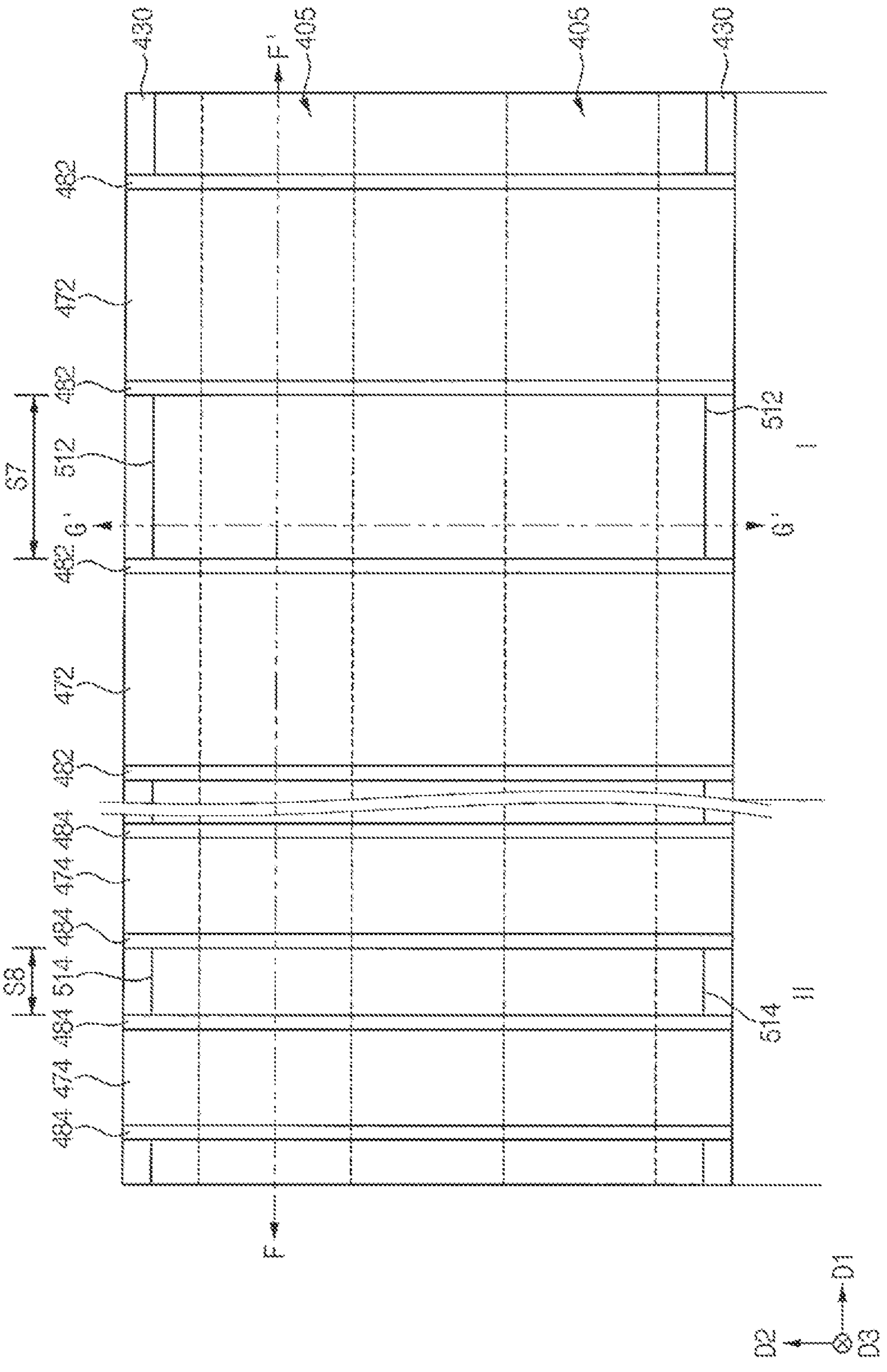

Referring to FIGS. 29 to 31, third and fourth gate spacers 482 and 484 may be formed on sidewalls of the third and fourth dummy gate structures 472 and 474, respectively.

Particularly, a second spacer layer may be formed on the substrate 400 having the fin structure, the second isolation pattern 430 and the third and fourth dummy gate structures 472 and 474 thereon, and may be anisotropically etched to form the third and fourth gate spacers 482 and 484 covering each of opposite sidewalls in the first direction D1 of the third and fourth dummy gate structures 472 and 482, respectively.

In example embodiments, the second spacer layer may have a constant thickness, and thus widths in the first direction D1 of the third and fourth gate spacers 482 and 484 may be substantially the same as each other.

The fifth distance S5 between neighboring ones of the third dummy gate structures 472 in the first direction D1 is greater than the sixth distance S6 between neighboring ones of the fourth dummy gate structures 474 in the first direction D1, and thus a seventh distance S7 between corresponding ones of the third gate spacers 482 on neighboring ones of the third dummy gate structures 472, respectively, in the first direction D1 and opposite to each other in the first direction D1 may be greater than an eighth distance S8 between corresponding ones of the fourth gate spacers 484 on neighboring ones of the fourth dummy gate structures 474, respectively, in the first direction D1 and opposite to each other in the first direction D1.

The fin structure and an upper portion of the second active pattern 405 on the first region I of the substrate 400 may be etched using the third dummy gate structure 472 and the third gate spacer 482 as an etching mask to form a seventh opening 492, and the fin structure and an upper portion of the second active pattern 405 on the second region II of the substrate 400 may be etched using the fourth dummy gate structure 474 and the fourth gate spacer 484 as an etching mask to form an eighth opening 494.

Thus, the sacrificial lines 412 and the semiconductor lines 422 under the third and fourth dummy gate structures 472 and 474 and the third and fourth gate spacers 482 and 484 may be transformed into sacrificial patterns 414 and semiconductor patterns 424, respectively, and the fin structure extending in the first direction D1 may be divided into a plurality of parts spaced apart from each other in the first direction D1.

In example embodiments, a third width W3 in the first direction D1 of the seventh opening 492 may be greater than a fourth width W4 in the first direction D1 of the eighth opening 494.

Hereinafter, the third dummy gate structure 472, the third gate spacer 482 on each of opposite sidewalls of the third dummy gate structure 472 and the fin structure may be referred to as a first stack structure, and the fourth dummy gate structure 474, the fourth gate spacer 484 on each of opposite sidewalls of the fourth dummy gate structure 474 and the fin structure may be referred to as a second stack structure.

In example embodiments, each of the first and second stack structures may extend in the second direction D2. In example embodiments, and a plurality of first stack structures may be spaced apart from each other in the first direction D1 on the first region I of the substrate 400, and a plurality of second stack structures may be spaced apart from each other in the first direction D1 on the second region II of the substrate 400.

A portion of each of the sacrificial patterns 414 adjacent to the seventh and eighth openings 492 and 494 may be removed to form a gap, and an inner spacer (not shown) may be formed in the gap.

A selective epitaxial growth (SEG) process may be performed using the upper surface of the active pattern 405 and the sidewalls of the semiconductor patterns 424 and the sacrificial patterns 414 exposed by the seventh and eighth openings 492 and 494 as a seed to form third and fourth source/drain layers 512 and 514 in the seventh and eighth openings 492 and 494, respectively.

In an example embodiment, a single crystalline silicon-germanium layer doped with p-type impurities may be formed as each of the third and fourth source/drain layers 512 and 514. In some example embodiments, a single crystalline silicon layer doped with n-type impurities or a single crystalline silicon carbide layer doped with n-type impurities may be formed as each of the third and fourth source/drain layers 512 and 514.

In example embodiments, the third and fourth source/drain layers 512 and 514 may be formed by the same SEG process, and thus the fourth source/drain layer 514 filling the eighth opening 494 having a relatively small width may have a flat upper surface, while the third source/drain layer 512 filling the seventh opening 492 having a relatively large width may have a concave upper surface. A central portion in the first direction D1 of the upper surface of the third source/drain layer 512 may be lower than the upper surface of the fourth source/drain layer 514.

In an example embodiment, a slope of the upper surface of the third source/drain layer 512 with respect to an upper surface of the substrate 400 may gradually decrease from the central portion toward the edge portion thereof.

Figure 32:
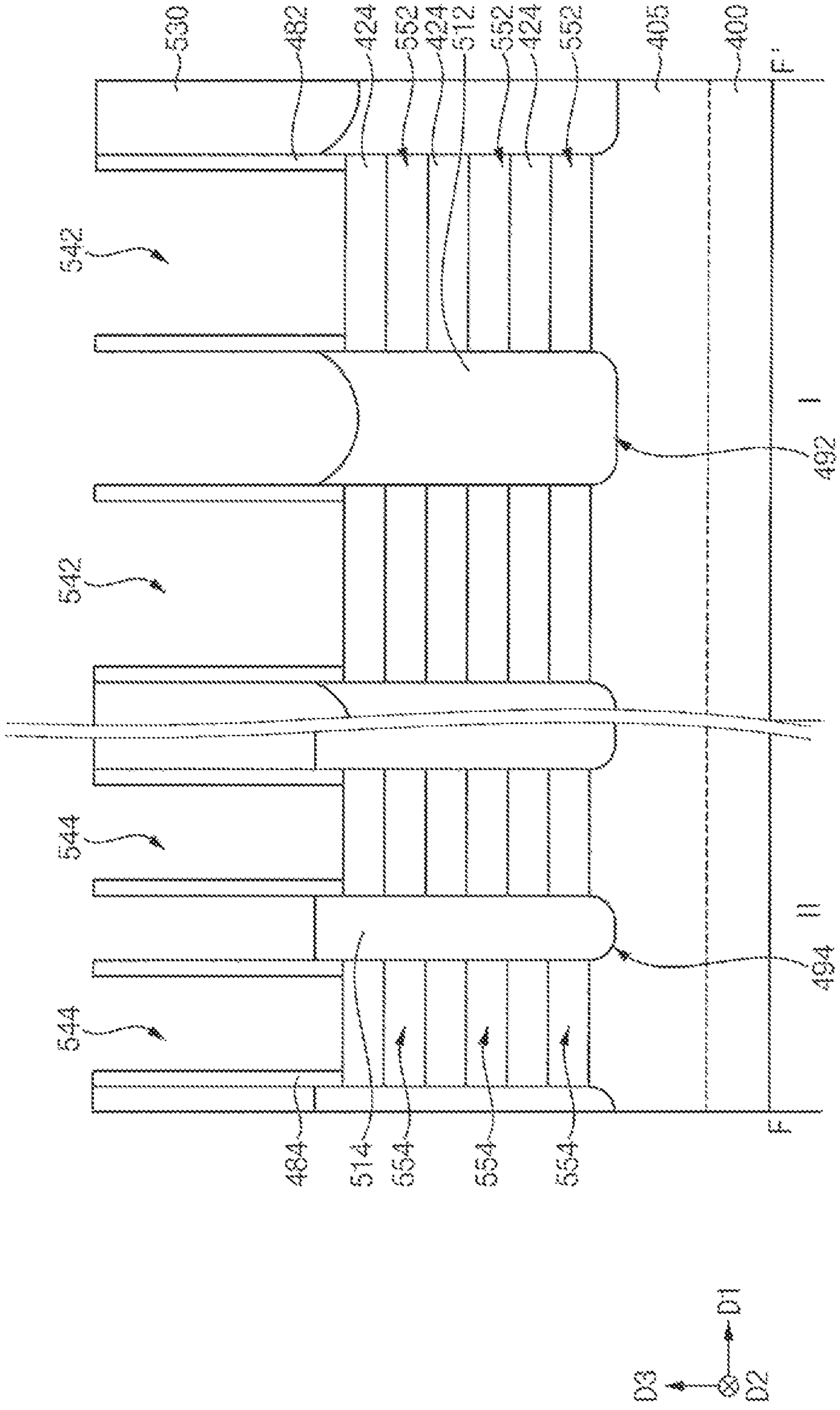

Referring to FIG. 32, a third insulating interlayer 530 may be formed on the substrate 400 to cover the first and second stack structures and the third and fourth source/drain layers 512 and 514, and a planarization process may be performed until upper surfaces of the second dummy gate electrodes 450 included in the first and second stack structures, respectively, are exposed so that an upper portion of the third insulating interlayer 530 and the second dummy gate masks 460 included in the third and fourth dummy gate structures 472 and 474, respectively.

The second dummy gate electrodes 450, the second dummy gate insulation patterns 440 and the sacrificial patterns 414 may be removed by, e.g., a wet etching process and/or a dry etching process. Thus, a ninth opening 542 exposing an inner sidewall of the third gate spacer 482 and an upper surface of an uppermost one of the semiconductor patterns 424, and a tenth opening 552 exposing a sidewall of the third source/drain layer 512, surfaces of the semiconductor patterns 424 and an upper surface of the second active pattern 405 may be formed on the first region I of the substrate 400. In example embodiments, an eleventh opening 544 exposing an inner sidewall of the fourth gate spacer 484 and an upper surface of an uppermost one of the semiconductor patterns 424, and a twelfth opening 554 exposing a sidewall of the fourth source/drain layer 514, surfaces of the semiconductor patterns 424 and an upper surface of the second active pattern 405 may be formed on the second region II of the substrate 400.

Figure 33:
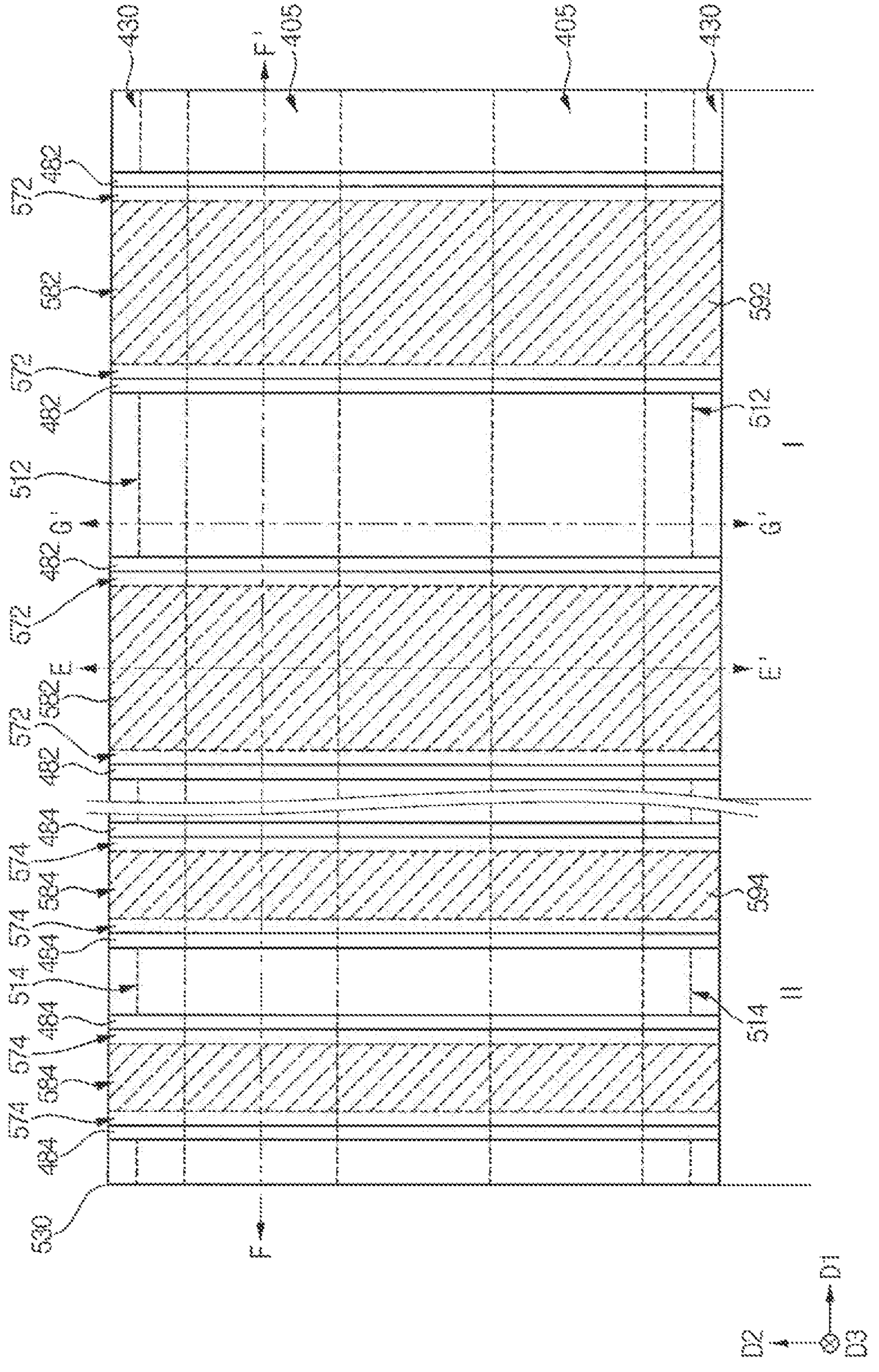
Figure 35:
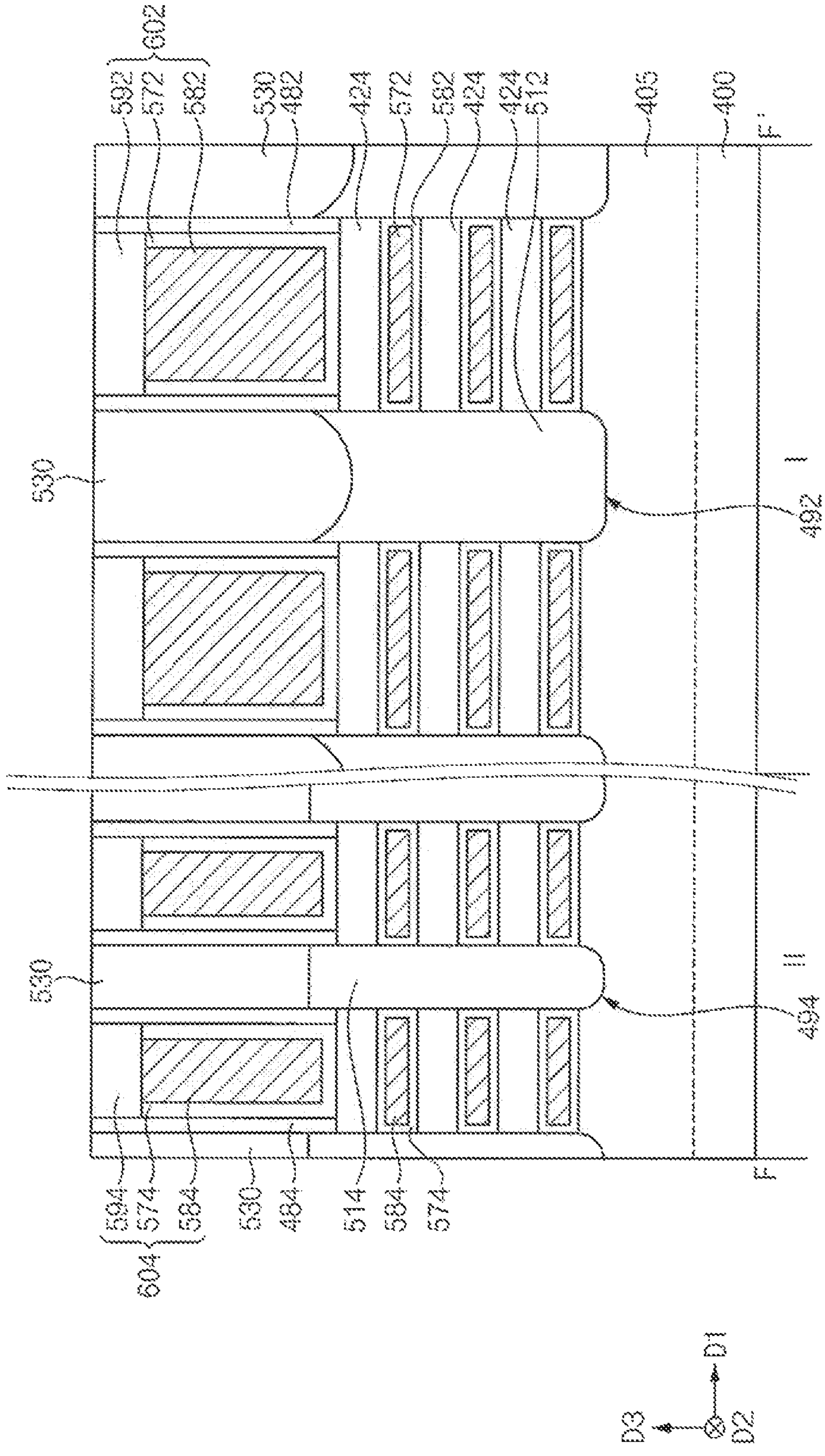

Referring to FIGS. 33 to 35, processes substantially the same as or similar to those illustrated with reference to FIGS. 12 to 14 may be performed.

Thus, a third gate structure 602 including a third gate insulation pattern 572 on the upper surface of the second active pattern 405, the upper surface of the second isolation pattern 430, the sidewall of the third source/drain layer 512, the surfaces of the semiconductor patterns 424 and an inner lower sidewall of the third gate spacer 482 in the ninth and tenth openings 542 and 552, a third gate electrode 582 on the third gate insulation pattern 572 and filling a lower portion of the ninth opening 542 and the tenth opening 552, and a third capping pattern 592 on the third gate insulation pattern 572 and the third gate electrode 582 and filling an upper portion of the ninth opening 542 to contact an inner upper sidewall of the third gate spacer 482 may be formed.

In example embodiments, a fourth gate structure 604 including a fourth gate insulation pattern 574 on the upper surface of the second active pattern 405, the upper surface of the second isolation pattern 430, the sidewall of the fourth source/drain layer 514, the surfaces of the semiconductor patterns 424 and an inner lower sidewall of the fourth gate spacer 484 in the eleventh and twelfth openings 544 and 554, a fourth gate electrode 584 on the fourth gate insulation pattern 574 and filling a lower portion of the eleventh opening 544 and the twelfth opening 554, and a fourth capping pattern 594 on the fourth gate insulation pattern 574 and the fourth gate electrode 584 and filling an upper portion of the eleventh opening 544 to contact an inner upper sidewall of the fourth gate spacer 484 may be formed.

In an example embodiment, an interface pattern (not shown) including, e.g., silicon oxide may be further formed on the upper surface of the second active pattern 405 and the surfaces of the semiconductor patterns 424.

Referring to FIGS. 20 to 23 again, processes substantially the same as or similar to those illustrated with reference to FIGS. 15 to 16 and FIGS. 1 to 4 may be performed.

Thus, a fourth insulating interlayer 620 may be formed on the third and fourth gate structures 602 and 604, the third and fourth gate spacers 482 and 484 and the third insulating interlayer 530. In example embodiments, fifth and sixth contact plugs 632 and 634 extending through the third and fourth insulating interlayers 530 and 620 to contact upper surfaces of the third and fourth source/drain layers 512 and 514, respectively, and seventh and eighth contact plugs 636 and 638 extending through the fourth insulating interlayer 620 to contact upper surfaces of the third and fourth gate electrodes 582 and 584, respectively, included in the third and fourth gate structures 602 and 604, respectively, may be formed.

In example embodiments, the fifth contact plug 632 may contact an edge portion in the first direction D1 of the upper surface of the third source/drain layer 512.

Figure 36:
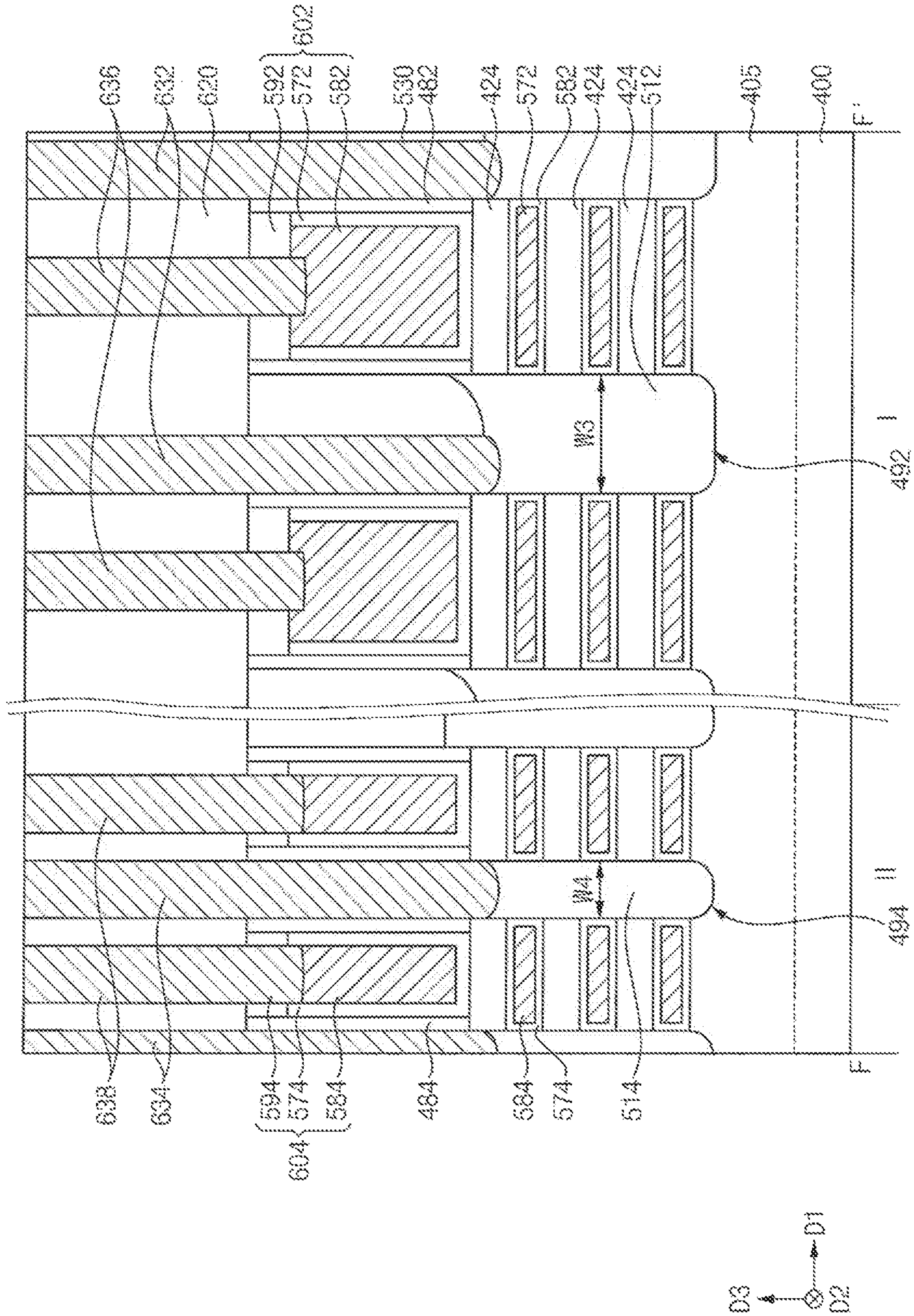
FIGS. 36 to 38 are cross-sectional views illustrating semiconductor devices in accordance with example embodiments.
Figure 37:
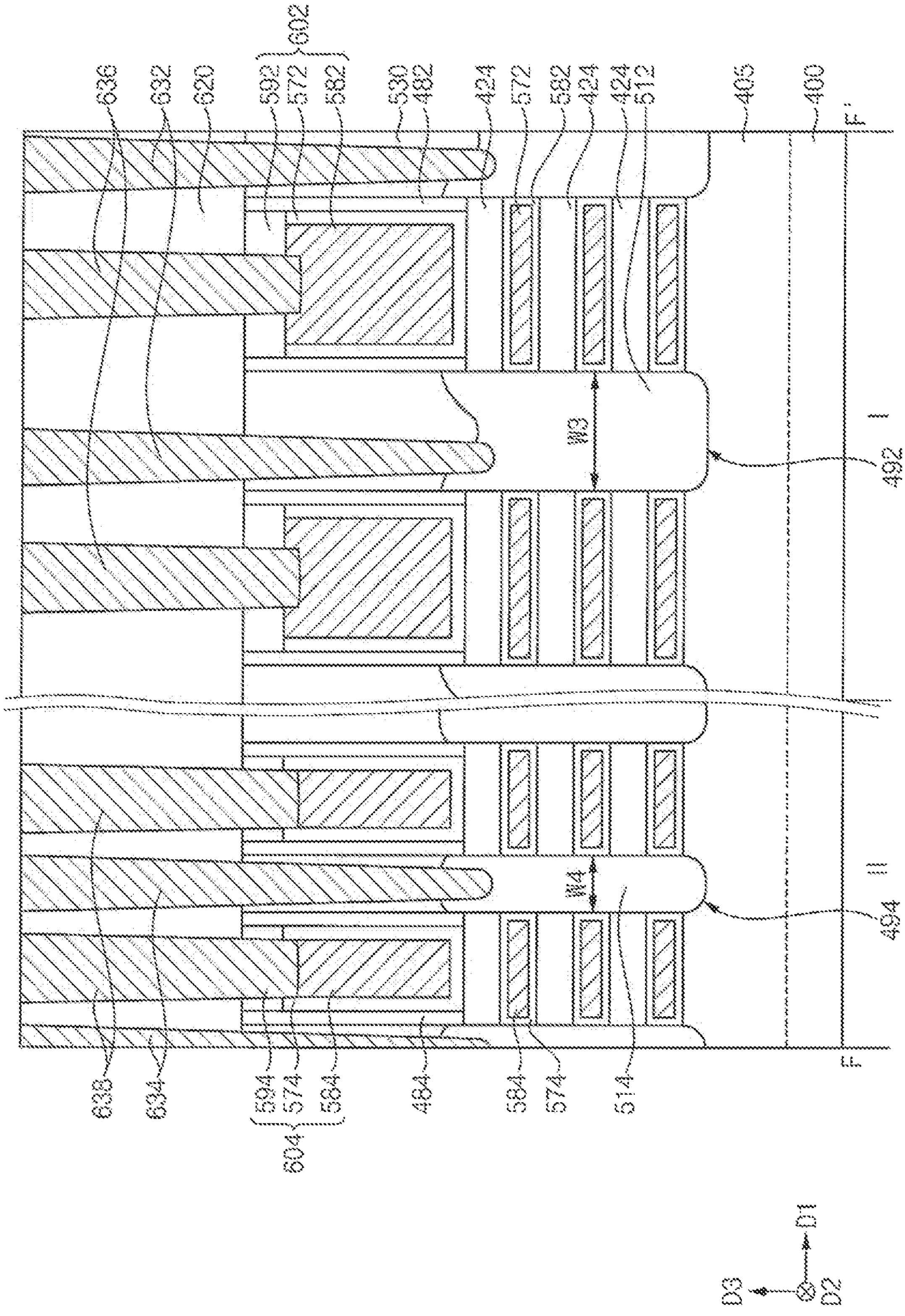
Figure 38:
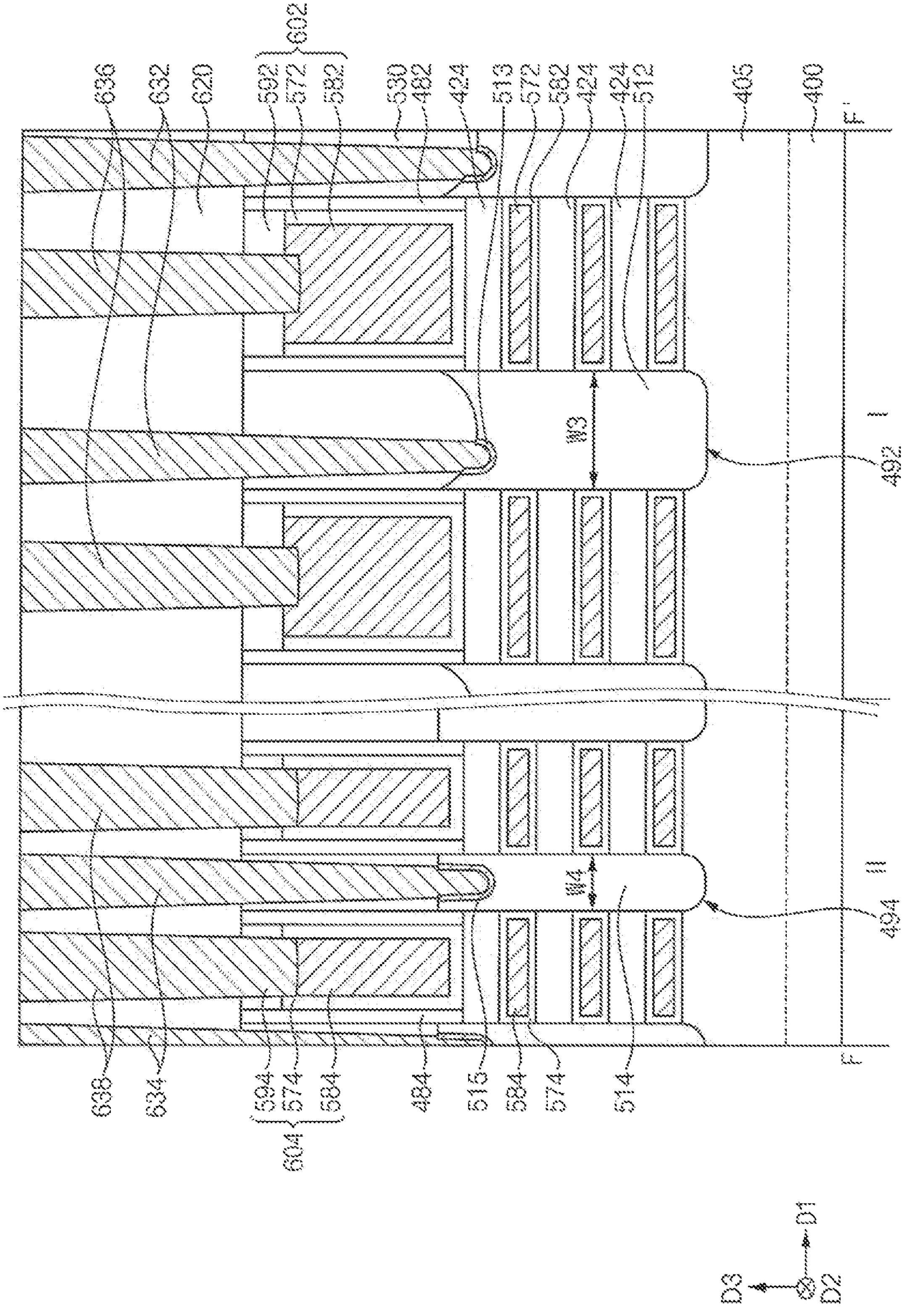

FIGS. 36 to 38 are cross-sectional views illustrating semiconductor devices in accordance with example embodiments, and may correspond to FIG. 22.

These semiconductor devices may include the characteristics of the semiconductor devices shown in FIGS. 17 to 19, and thus repeated explanations thereof are omitted herein for conciseness.

Referring to FIG. 36, the sixth contact plug 634 may contact both of the fourth gate spacers 484 at opposite sides, respectively, in the first direction D1, and the fifth contact plug 632 may contact one of the third gate spacers 482 at opposite sides, respectively, in the first direction D1. That is, the sixth contact plug 634 may be self-aligned with both of the fourth gate spacers 484, and the fifth contact plug 632 may be self-aligned with one of the third gate spacers 482.

Referring to FIG. 37, a slope of the upper surface of the third source/drain layer 512 with respect to the upper surface of the substrate 400 may gradually increase from the central portion to a given portion between the central portion and the edge portion, and then may gradually decrease from the given portion to the edge portion.

The upper surface of the fourth source/drain layer 514 may have a convex shape, and thus a central portion of the upper surface of the fourth source/drain layer 514 may be higher than an edge portion thereof.

Referring to FIG. 38, a third metal silicide pattern 513 may be formed between the fifth contact plug 632 and the third source/drain layer 512, and a fourth metal silicide pattern 515 may be formed between the sixth contact plug 634 and the fourth source/drain layer 514.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present disclosure. Accordingly, all such modifications are intended to be included within the scope of the present disclosure as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A semiconductor device comprising:

a first gate structure on a substrate, the first gate structure extending in a second direction parallel to an upper surface of the substrate;

a first source/drain layer at a side of the first gate structure in a first direction, the first direction being substantially parallel to the upper surface of the substrate and crossing the second direction, and a central portion in the first direction of an upper surface of the first source/drain layer being lower than an edge portion in the first direction of the upper surface of the first source/drain layer; and a first contact plug on the first source/drain layer, the first contact plug contacting the edge portion of the upper surface of the first source/drain layer so that a center of the first contact plug is offset from a center of the upper surface in the first direction of the first source/drain layer, wherein a contact interface between the first contact plug and the first source/drain layer is completely offset in the first direction from a lowermost point of the upper surface of the first source/drain layer, wherein the lowermost point is a center of the central portion, and wherein the contact interface is spaced apart from the lowermost point in a plan view.

2. The semiconductor device as claimed in claim 1, wherein the upper surface of the first source/drain layer is concave.

3. The semiconductor device as claimed in claim 2, wherein a slope of the upper surface of the first source/drain layer with respect to the upper surface of the substrate gradually increases from the central portion to the edge portion of the upper surface.

4. The semiconductor device as claimed in claim 2, wherein a slope of the upper surface of the first source/drain layer with respect to the upper surface of the substrate gradually increases from the central portion to a given portion of the upper surface and gradually decreases from the given portion to the edge portion of the upper surface.

5. The semiconductor device as claimed in claim 1, wherein a cross-section of the first source/drain layer in the second direction has a shape of a pentagon or a rhombus.

6. The semiconductor device as claimed in claim 1, further comprising a gate spacer on each of opposite sidewalls of the first gate structure in the first direction, wherein the first contact plug is spaced apart from a sidewall of the gate spacer in the first direction.

7. The semiconductor device as claimed in claim 1, further comprising a gate spacer on each of opposite sidewalls of the first gate structure in the first direction, wherein the first contact plug contacts a sidewall of the gate spacer in the first direction.

8. The semiconductor device as claimed in claim 1, further comprising:

a second gate structure on the substrate, the second gate structure extending in the second direction;

a second source/drain layer at a side of the second gate structure in the first direction, a central portion in the first direction of an upper surface of the second source/drain layer not being lower than an edge portion in the first direction of the upper surface of the second source/drain layer; and a second contact plug on the second source/drain layer, the second contact plug contacting the central portion of the upper surface of the second source/drain layer.

9. The semiconductor device as claimed in claim 8, wherein a width in the first direction of the first gate structure is greater than a width in the first direction of the second gate structure.

10. The semiconductor device as claimed in claim 8, wherein a width in the first direction of the first source/drain layer is greater than a width in the first direction of the second source/drain layer.

11. The semiconductor device as claimed in claim 8, wherein the first gate structure is one of a plurality of first gate structures spaced apart from each other in the first direction by a first distance, and the second gate structure is one of a plurality of second gate structures spaced apart from each other in the first direction by a second distance less than the first distance.

12. The semiconductor device as claimed in claim 1, wherein the first gate structure protrudes from the upper surface of the substrate in a vertical direction substantially perpendicular to the upper surface of the substrate.

13. The semiconductor device as claimed in claim 12, further comprising channels spaced apart from each other in a third direction on an active pattern, wherein the first gate structure covers lower and upper surfaces and each of opposite sidewalls in the second direction of each of the channels.

14. A semiconductor device comprising:

a gate structure on a substrate, the gate structure extending in a second direction parallel to an upper surface of the substrate;

a first source/drain layer and a second source/drain layer at opposite sides, respectively, in a first direction of the gate structure, the first direction being substantially parallel to the upper surface of the substrate and crossing the second direction, and a central portion in the first direction of an upper surface of each of the first source/drain layer and the second source/drain layer being lower than an edge portion in the first direction of the upper surface; and a first contact plug and a second contact plug on the first source/drain layer and the second source/drain layer, respectively, wherein the first contact plug contacts one edge portion of opposite edge portions of the upper surface of the first source/drain layer so that a center of the first contact plug is offset from a center of the one edge portion of the upper surface of the first source/drain layer, the one edge portion being proximal to the gate structure in the first direction, wherein a contact interface between the first contact plug and the first source/drain layer is completely offset in the first direction from a lowermost point of the upper surface of the first source/drain layer, wherein the lowermost point is a center of the central portion, wherein the contact interface is spaced apart from the lowermost point in a plan view, and wherein the second contact plug contacts one edge portion of opposite edge portions of the upper surface of the second source/drain layer so that a center of the second contact plug is offset from a center of the one edge portion of the upper surface of the second source/drain layer, the one edge portion being distal to the gate structure in the first direction.

15. The semiconductor device as claimed in claim 14, wherein the upper surface of each of the first source/drain layer and the second source/drain layer is concave.

16. The semiconductor device as claimed in claim 14, further comprising a first gate spacer and a second gate spacer on opposite sidewalls, respectively, in the first direction of the gate structure, wherein the first contact plug is spaced apart from a sidewall of the first gate spacer in the first direction.

17. The semiconductor device as claimed in claim 14, further comprising a first gate spacer and a second gate spacer on opposite sidewalls, respectively, in the first direction of the gate structure, wherein the first contact plug contacts a sidewall of the first gate spacer in the first direction.

18. A semiconductor device comprising:

first gate structures on a substrate including a first region and a second region, the first gate structures being spaced apart from each other in a first direction by a first distance on the first region of the substrate, each of the first gate structures extending in a second direction, each of the first direction and the second direction being substantially parallel to an upper surface of the substrate, and the first direction crossing the second direction;

a first source/drain layer on a portion of the substrate between the first gate structures, a central portion in the first direction of an upper surface of the first source/drain layer being lower than an edge portion in the first direction of the upper surface of the first source/drain layer;

a first contact plug on the first source/drain layer, the first contact plug contacting the edge portion of the upper surface of the first source/drain layer so that a center of the first contact plug is offset from a center of the upper surface of the first source/drain layer;

second gate structures on the substrate, the second gate structures being spaced apart from each other in the first direction by a second distance on the second region of the substrate, each of the second gate structures extending in the second direction;

a second source/drain layer on a portion of the substrate between the second gate structures, a central portion in the first direction of an upper surface of the second source/drain layer not being lower than an edge portion in the first direction of the upper surface of the second source/drain layer; and a second contact plug on the second source/drain layer, the second contact plug contacting the central portion of the upper surface of the second source/drain layer, wherein a contact interface between the first contact plug and the first source/drain layer is completely offset in the first direction from a lowermost point of the upper surface of the first source/drain layer, wherein the lowermost point is a center of the central portion, and wherein the contact interface is spaced apart from the lowermost point in a plan view.

19. The semiconductor device as claimed in claim 18, wherein the first distance is greater than the second distance.

20. The semiconductor device as claimed in claim 18, wherein a width in the first direction of the first source/drain layer is greater than a width in the first direction of the second source/drain layer.

* * * * *